US011038463B2

(12) United States Patent
Sawada et al.

(10) Patent No.: US 11,038,463 B2
(45) Date of Patent: Jun. 15, 2021

(54) INTEGRATED CIRCUIT DEVICE, OSCILLATOR, ELECTRONIC APPARATUS, AND VEHICLE

(71) Applicant: Seiko Epson Corporation, Tokyo (JP)

(72) Inventors: Mitsuaki Sawada, Fujimi (JP); Naoki Ii, Suwa (JP); Yosuke Itasaka, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/835,440

(22) Filed: Mar. 31, 2020

(65) Prior Publication Data

US 2020/0313619 A1 Oct. 1, 2020

(30) Foreign Application Priority Data

Apr. 1, 2019 (JP) .............................. JP2019-069775

(51) Int. Cl.
*H03B 5/36* (2006.01)
*H03B 5/04* (2006.01)
*H03H 9/19* (2006.01)
*H03H 9/10* (2006.01)
*H03H 9/05* (2006.01)

(52) U.S. Cl.
CPC ................ *H03B 5/36* (2013.01); *H03B 5/04* (2013.01); *H03H 9/0557* (2013.01); *H03H 9/10* (2013.01); *H03H 9/19* (2013.01)

(58) Field of Classification Search
CPC ...................................................... H03B 5/36
USPC ........................................................... 331/66
See application file for complete search history.

(56) References Cited

U.S. PATENT DOCUMENTS

| 5,500,628 A * | 3/1996 | Knecht | H03B 5/32 310/348 |
|---|---|---|---|
| 2016/0094182 A1 | 3/2016 | Kobayashi et al. | |
| 2016/0218718 A1 | 7/2016 | Yamamoto | |
| 2016/0218719 A1 | 7/2016 | Yamamoto | |
| 2016/0241190 A1 | 8/2016 | Itasaka et al. | |
| 2017/0040942 A1* | 2/2017 | Isohata | H03B 5/36 |
| 2017/0194966 A1 | 7/2017 | Yonezawa | |

(Continued)

FOREIGN PATENT DOCUMENTS

| JP | 2013-183212 A | 9/2013 |
|---|---|---|
| JP | 2016-072297 A | 5/2016 |
| JP | 2016-134888 A | 7/2016 |

(Continued)

*Primary Examiner* — Joseph Chang
(74) *Attorney, Agent, or Firm* — Harness, Dickey & Pierce, P.L.C.

(57) ABSTRACT

An integrated circuit device includes a first pad and a second pad electrically coupled to one end and the other end of a resonator, an oscillation circuit that is electrically coupled to the first pad and the second pad and generates an oscillation signal by causing the resonator to oscillate, and an output circuit that outputs a clock signal based on the oscillation signal. The oscillation circuit is disposed along a first side of the integrated circuit device among the first side, a second side that intersects the first side, a third side that is an opposite side of the first side, and a fourth side that is an opposite side of the second side. The first pad and the second pad are disposed in the oscillation circuit along the first side in a plan view, and the output circuit is disposed along the second side.

15 Claims, 17 Drawing Sheets

(56) References Cited

U.S. PATENT DOCUMENTS

2018/0108627 A1* 4/2018 Yamamoto .......... H01L 23/3114

FOREIGN PATENT DOCUMENTS

| | | |
|---|---|---|
| JP | 2016-134889 A | 7/2016 |
| JP | 2016-152447 A | 8/2016 |
| JP | 2017-123631 A | 7/2017 |
| JP | 2018-098428 A | 6/2018 |

* cited by examiner

FIG. 3
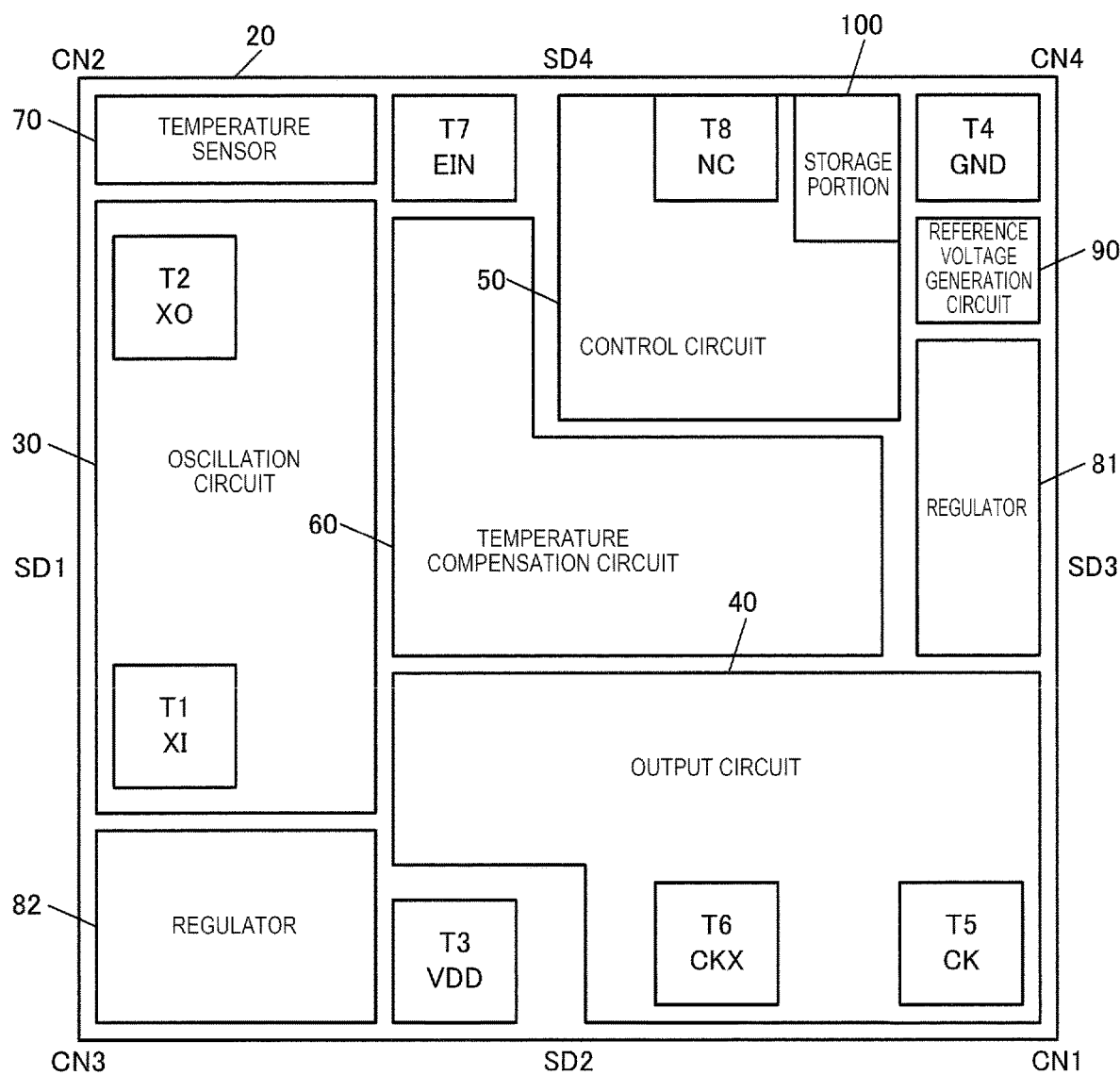
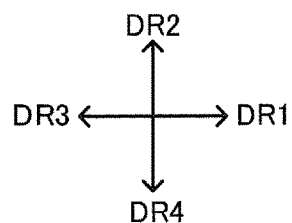

FIG. 4
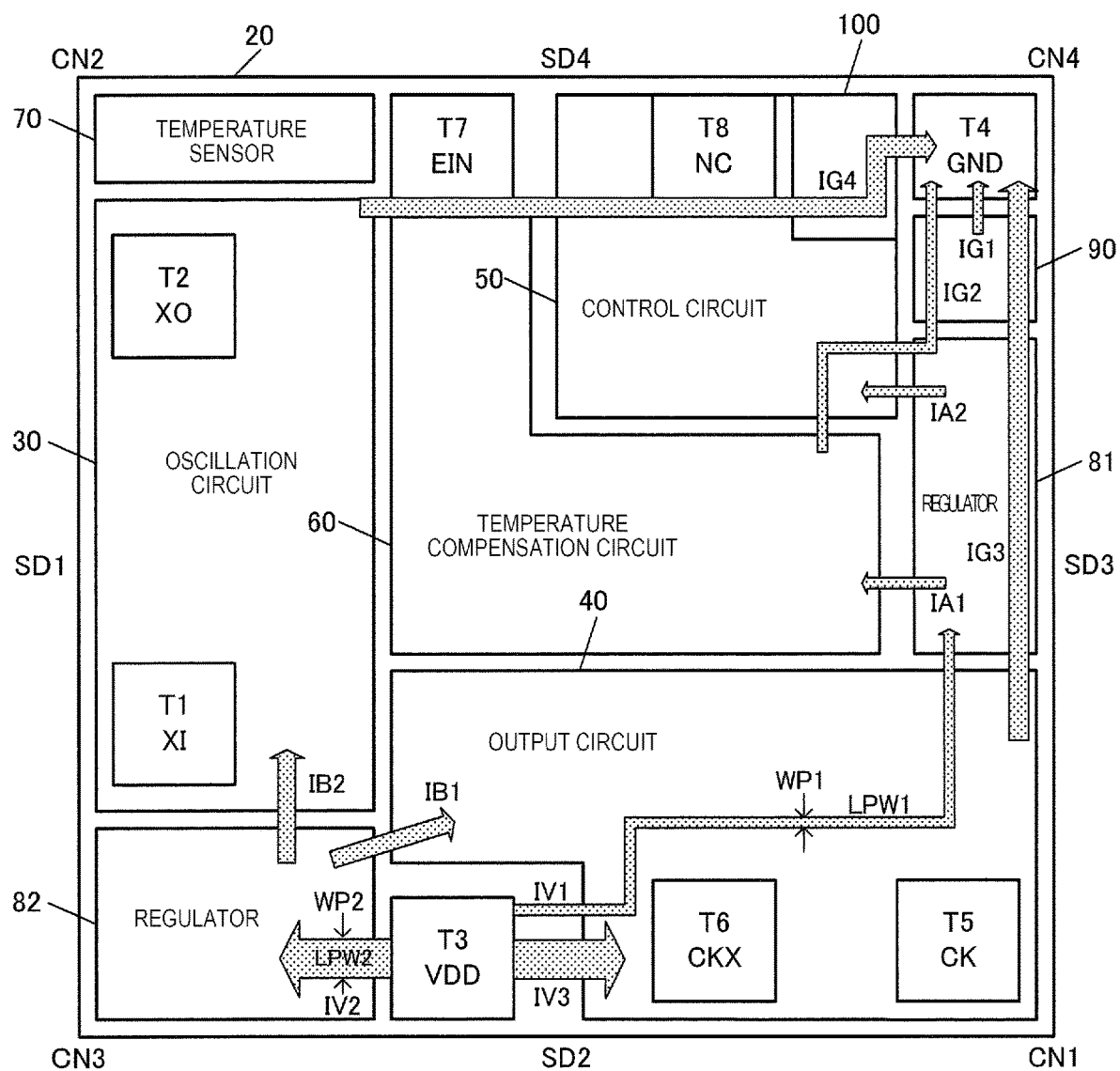
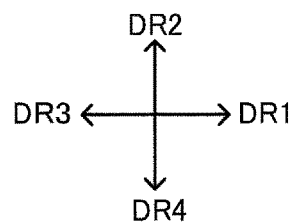

FIG. 6
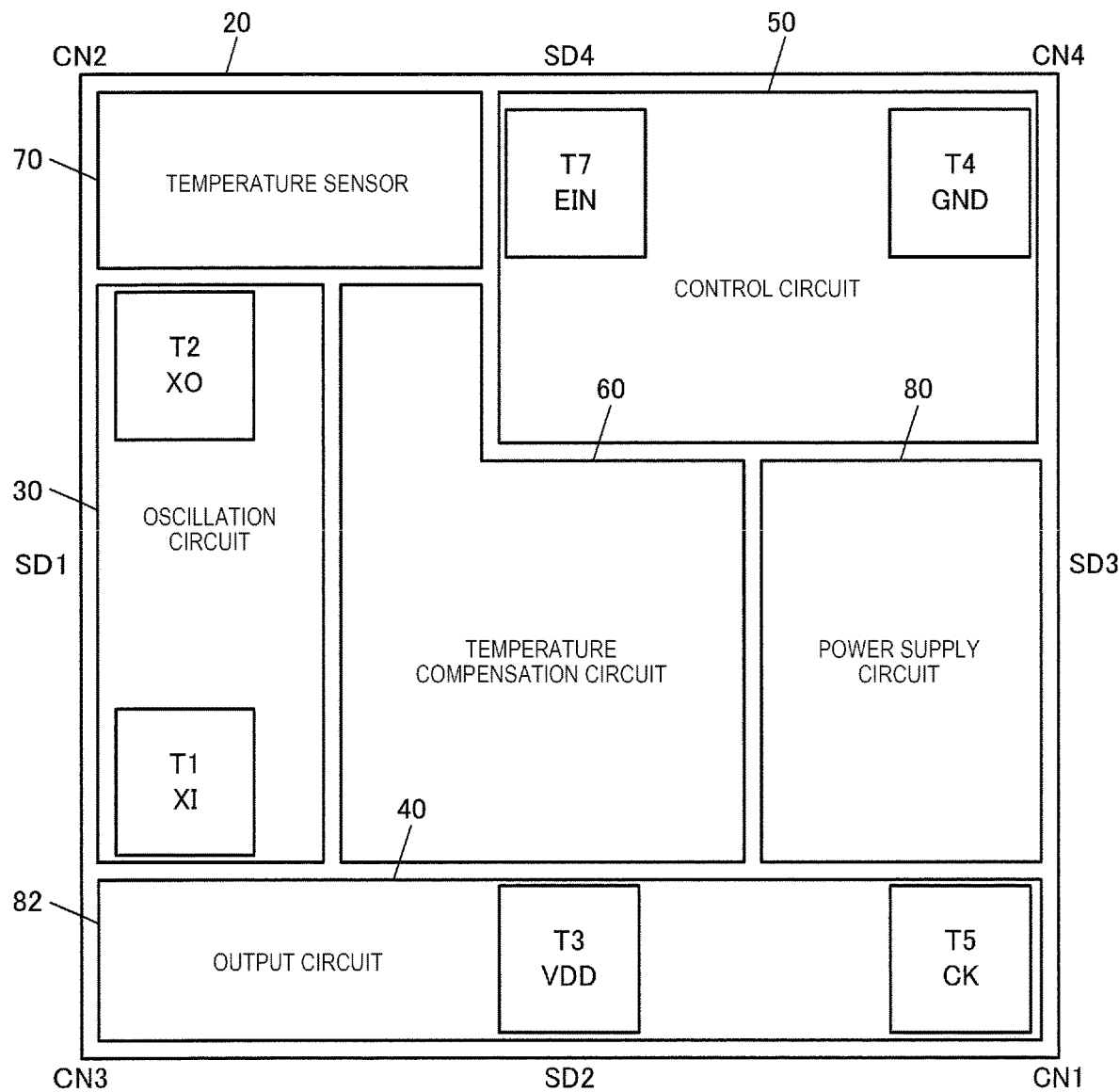
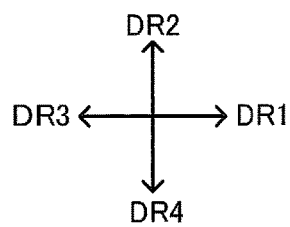

US 11,038,463 B2

INTEGRATED CIRCUIT DEVICE, OSCILLATOR, ELECTRONIC APPARATUS, AND VEHICLE

The present application is based on, and claims priority from JP Application Serial Number 2019-069775, filed Apr. 1, 2019, the disclosure of which is hereby incorporated by reference herein in its entirety.

BACKGROUND

1. Technical Field

The present disclosure relates to an integrated circuit device, an oscillator, an electronic apparatus, and a vehicle.

2. Related Art

In the related art, an integrated circuit device having an oscillation circuit that causes a resonator such as a quartz crystal resonator to oscillate is known. JP-A-2018-98428 discloses a layout arrangement of such an integrated circuit device. JP-A-2018-98428 discloses a layout arrangement method of pads to which resonators are coupled, pads to which power is supplied, and power supply lines. In the integrated circuit device of JP-A-2018-98428, two pads coupled to the resonator are disposed at each of two opposing sides of the integrated circuit device. These two pads are called an XI pad and an XO pad.

When the distance between the two pads coupled to the resonator becomes longer, the wiring length of the signal line coupling these pads and the oscillation circuit becomes longer. As described above, when the wiring length of the signal line coupling the pad and the oscillation circuit becomes long, the parasitic resistance and parasitic capacitance of the signal line increase, and the oscillation characteristics may be deteriorated. Further, it is desirable to reduce noise such as radiation noise generated in the high frequency signal path.

SUMMARY

An aspect of the present disclosure relates to an integrated circuit device including a first pad electrically coupled to one end of a resonator, a second pad electrically coupled to the other end of the resonator, an oscillation circuit that is electrically coupled to the first pad and the second pad and generates an oscillation signal by causing the resonator to oscillate, and an output circuit that outputs a clock signal based on the oscillation signal, in which the oscillation circuit is disposed along a first side of the integrated circuit device among the first side, a second side that intersects the first side, a third side that is an opposite side of the first side, and a fourth side that is an opposite side of the second side, the first pad and the second pad are disposed in the oscillation circuit along the first side in plan view, and the output circuit is disposed along the second side.

BRIEF DESCRIPTION OF THE DRAWINGS

FIG. 3 is a layout arrangement example of the integrated circuit device.
FIG. 4 is a schematic diagram showing a current path in the integrated circuit device.
FIG. 6 is another layout arrangement example of the integrated circuit device.

DESCRIPTION OF EXEMPLARY EMBODIMENTS

Hereinafter, the present embodiment will be described. The present embodiment described below does not unduly limit the contents described in the appended claims. Further, not all of the configurations described in the present embodiment are essential configuration requirements.

1. Integrated Circuit Device

Figure 1:
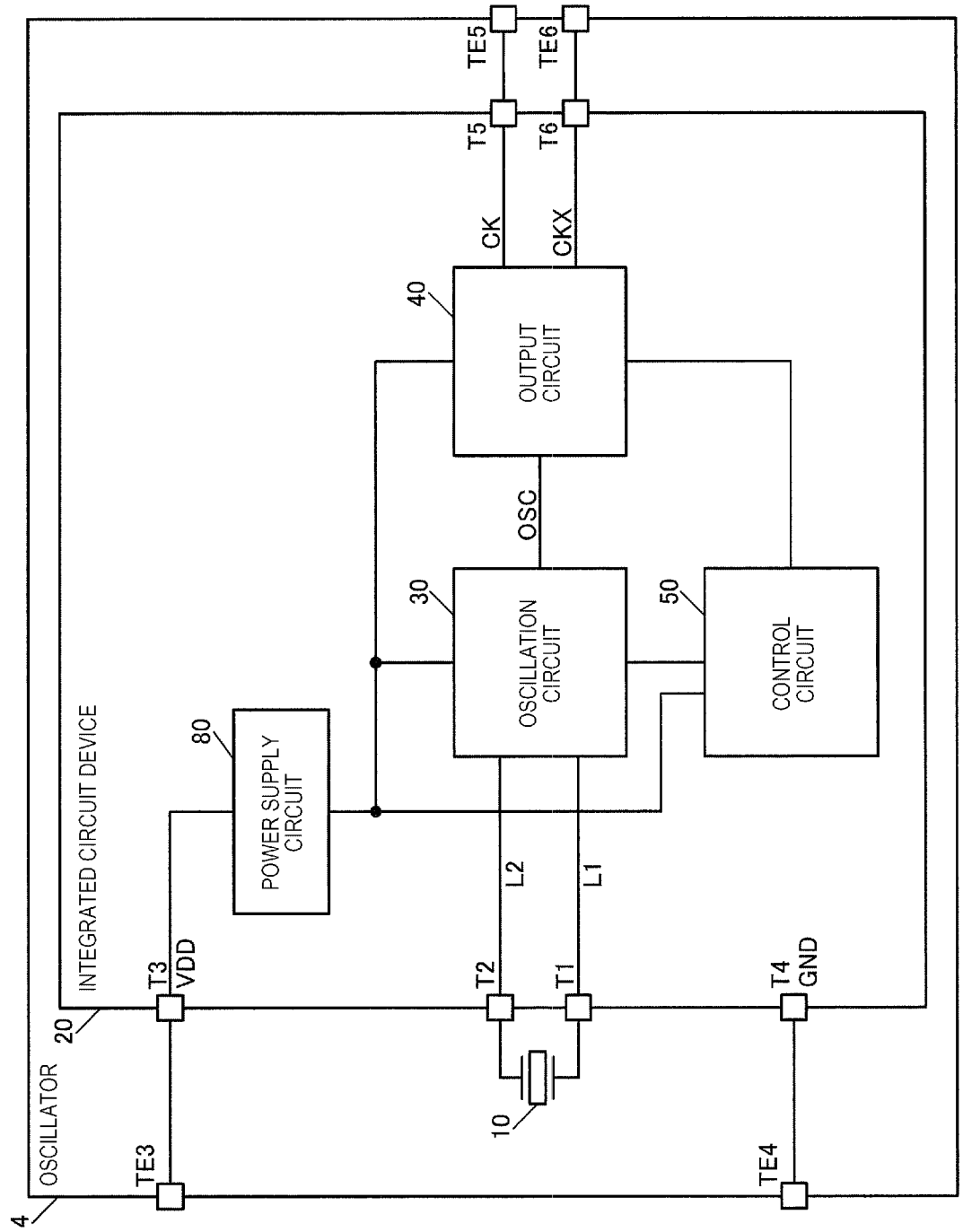
FIG. 1 is a configuration example of an integrated circuit device of a present embodiment.

FIG. 1 is a configuration example of an integrated circuit device 20 of a present embodiment. The integrated circuit device 20 of the present embodiment includes pads T1 and T2, an oscillation circuit 30, and an output circuit 40. Further, an oscillator 4 of the present embodiment includes a resonator 10 and the integrated circuit device 20. The resonator 10 is electrically coupled to the integrated circuit device 20. For example, the resonator 10 and the integrated circuit device 20 are electrically coupled using internal wiring, a bonding wire, a metal bump, or the like of a package that houses the resonator 10 and the integrated circuit device 20.

The resonator 10 is an element that generates mechanical resonance by an electric signal. The resonator 10 can be realized by a resonator element such as a quartz crystal resonator element. For example, the resonator 10 can be realized by a quartz crystal resonator element that has a cut angle of AT cut or SC cut and generates thickness-shear resonance. For example, the resonator 10 may be a resonator incorporated in a temperature compensated crystal oscillator (TCXO) that does not include a constant temperature chamber or a resonator incorporated in a constant temperature chamber type quartz crystal oscillator (OCXO) that includes a constant temperature chamber. The resonator 10 of the present embodiment can be realized by various resonator elements such as a resonator element of a type other than a thickness-shear resonance type and a piezoelectric resonator element formed of a material other than quartz crystal. For example, a surface acoustic wave (SAW) resonator or a micro electro mechanical systems (MEMS) resonator as a silicon resonator that is formed using a silicon substrate may be employed as the resonator 10.

The integrated circuit device 20 is a circuit device called an integrated circuit (IC). For example, the integrated circuit device 20 is an IC manufactured by a semiconductor process, and is a semiconductor chip in which circuit elements are formed in a semiconductor substrate.

The integrated circuit device 20 includes the pads T1 and T2, the oscillation circuit 30, and the output circuit 40. Further, the integrated circuit device 20 may also include a power supply pad T3, a ground pad T4, clock pads T5 and T6, a control circuit 50, and a power supply circuit 80. The pad is a terminal of the integrated circuit device 20. For example, in the pad area, a metal layer is exposed from a passivation film which is an insulating layer. For example, the exposed metal layer constitutes a pad.

The pad T1 is electrically coupled to one end of the resonator 10, and the pad T2 is electrically coupled to the other end of the resonator 10. For example, the resonator 10 and the pads T1 and T2 of the integrated circuit device 20 are electrically coupled using internal wiring, a bonding wire, a metal bump, or the like of a package that houses the resonator 10 and the integrated circuit device 20. The pad T1 is a first pad and the pad T2 is a second pad. The pads T1 and T2 are electrically coupled to the oscillation circuit 30 via signal lines L1 and L2. The signal lines L1 and L2 are wirings that couple the pads T1 and T2 and the oscillation circuit 30.

The power supply pad T3 is a pad to which a power supply voltage VDD is supplied. For example, the power supply voltage VDD is supplied to the power supply pad T3 from an external power supply device. The ground pad T4 is a pad to which GND that is a ground voltage is supplied. GND can also be referred to as VSS, and the ground voltage is, for example, a ground potential. In the present embodiment, the ground is appropriately described as GND. The clock pads T5 and T6 are pads to which clock signals CK and CKX generated based on an oscillation signal OSC of the oscillation circuit 30 are output. Here, the clock signals CK and CKX constituting a differential clock signal are output. The clock signals CK and CKX can be called a first clock signal and a second clock signal that constitute the differential clock signal. The clock signal may be output in a single-ended CMOS or clipped sine wave signal format that is not differential. The power supply pad T3, the ground pad T4, and the clock pads T5 and T6 are electrically coupled to external terminals TE3, TE4, TE5, and TE6 for external coupling of the oscillator 4, respectively. For example, they are electrically coupled using internal wiring of a package, a bonding wire, a metal bump, or the like. The external terminals TE3, TE4, TE5, and TE6 of the oscillator 4 are electrically coupled to an external device.

The oscillation circuit 30 is a circuit that causes the resonator 10 to oscillate. For example, the oscillation circuit 30 is electrically coupled to the pad T1 and the pad T2, and generates the oscillation signal OSC by causing the resonator 10 to oscillate. For example, the oscillation circuit 30 drives the resonator 10 via the signal line L1 and the signal line L2 coupled to the pads T1 and T2, and causes the resonator 10 to oscillate. For example, the oscillation circuit 30 includes an oscillation drive circuit provided between the pads T1 and T2. For example, the oscillation circuit 30 can be realized by a transistor such as a bipolar transistor that implements a drive circuit and a passive element such as a capacitor or a resistor. The drive circuit is a core circuit of the oscillation circuit 30, and the drive circuit causes the resonator 10 to oscillate by driving the resonator 10 with current or voltage. As the oscillation circuit 30, for example, various types of oscillation circuits such as Pierce type, Colpitts type, inverter type, or Hartley type can be used. Further, the oscillation circuit 30 may be provided with a variable capacitance circuit, and the oscillation frequency may be adjusted by adjusting the capacitance of the variable capacitance circuit. The variable capacitance circuit can be realized by a variable capacitance element such as a varactor. For example, the variable capacitance circuit is electrically coupled to the signal line L1 to which the pad T1 is coupled. The oscillation circuit 30 may include a first variable capacitance circuit electrically coupled to the signal line L1 to which the pad T1 is coupled and a second variable capacitance circuit electrically coupled to the signal line L2 to which the pad T2 is coupled. The coupling in the present embodiment is an electrical coupling. The electrical coupling means that an electrical signal is transmitted so that information can be transmitted by the electrical signal. The electrical coupling may be a coupling via an active element or the like.

The output circuit 40 outputs the clock signals CK and CKX based on the oscillation signal OSC from the oscillation circuit 30. For example, the output circuit 40 buffers the oscillation signal OSC from the oscillation circuit 30 and outputs the clock signals CK and CKX. For example, the output circuit 40 can perform waveform shaping of the oscillation signal OSC, level shift of the voltage level, and the like. The output circuit 40 can output the clock signals CK and CKX to the outside in various signal formats, for example. For example, the output circuit 40 outputs the clock signals CK and CKX to the outside in a signal format such as low voltage differential signaling (LVDS), positive emitter coupled logic (PECL), high speed current steering logic (HCSL), or differential complementary MOS (CMOS). For example, the output circuit 40 may be a circuit that can output a clock signal in at least two signal formats of LVDS, PECL, HCSL, and differential CMOS. In this case, the output circuit 40 outputs a clock signal in the signal format set by the control circuit 50. The signal format of the clock signal output from the output circuit 40 is not limited to a differential signal format, and may be a non-differential signal format such as a single-ended CMOS or clipped sine wave. In this case, the output of the clock signal CKX is unnecessary.

The control circuit 50 performs various control processes. For example, the control circuit 50 controls the entire integrated circuit device 20. For example, the control circuit 50 controls the operation sequence of the integrated circuit device 20. The control circuit 50 performs various processes for controlling the oscillation circuit 30. The control circuit 50 can also control the output circuit 40 and the power supply circuit 80. The control circuit 50 can be realized by, for example, an application specific integrated circuit (ASIC) using automatic placement and routing such as a gate array.

The power supply circuit 80 is supplied with the power supply voltage VDD from the power supply pad T3 and supplies various power supply voltages for the internal circuit of the integrated circuit device 20 to the internal circuit. For example, the power supply voltage VDD itself is supplied, or a power supply voltage obtained by regulating the external power supply voltage VDD is supplied. In the case of the configuration of FIG. 1, the integrated circuit device 20 may not have the temperature compensation function. In this case, the oscillator 4 is a simple packaged crystal oscillator (SPXO) oscillator.

Figure 2:
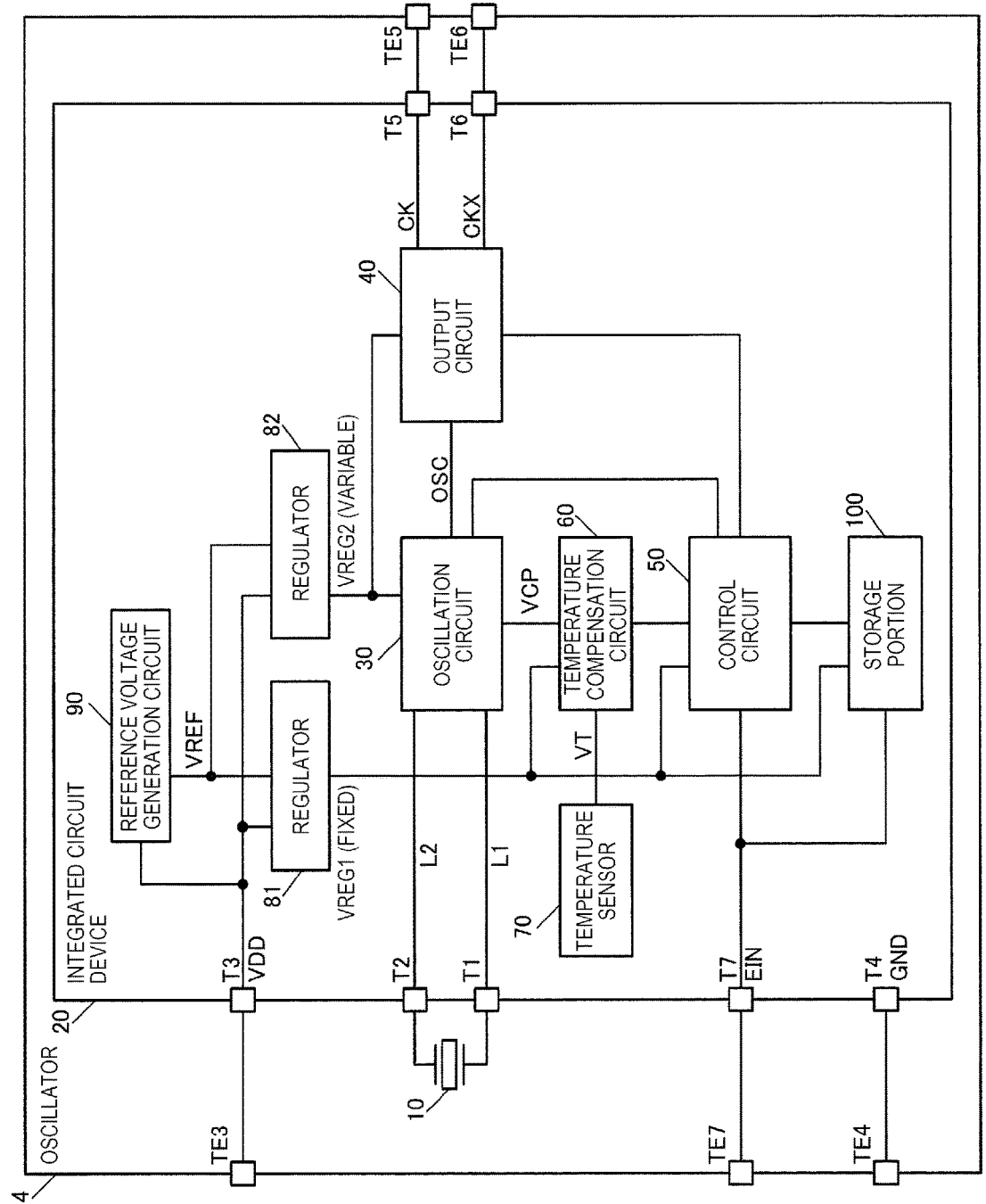
FIG. 2 is a detailed configuration example of the integrated circuit device of the present embodiment.

FIG. 2 shows a detailed configuration example of the integrated circuit device 20. In FIG. 2, in addition to the configuration of FIG. 1, a temperature compensation circuit 60, a temperature sensor 70, regulators 81 and 82, reference voltage generation circuit 90, storage portion 100, and pad T7 are further provided.

The temperature sensor 70 is a sensor that detects temperature. Specifically, the temperature sensor 70 outputs a temperature-dependent voltage that changes according to the temperature of the environment as the temperature detection voltage VT. For example, the temperature sensor 70 generates a temperature detection voltage VT using a circuit element having temperature dependency. Specifically, the temperature sensor 70 uses the temperature dependency of the forward voltage of the PN junction to output the temperature detection voltage VT whose voltage value changes depending on the temperature. As the forward voltage of the PN junction, for example, the base-emitter voltage of a bipolar transistor can be used.

The temperature compensation circuit 60 performs temperature compensation of the oscillation frequency of the oscillation circuit 30. For example, the temperature compensation circuit 60 generates a temperature compensation voltage VCP based on the temperature detection voltage VT from the temperature sensor 70, and outputs the temperature compensation voltage VCP to the oscillation circuit 30, thereby compensating the temperature of the oscillation frequency of the oscillation circuit 30. For example, the temperature compensation circuit 60 performs temperature compensation on the variable capacitance circuit included in the oscillation circuit 30 by outputting a temperature compensation voltage VCP that is a capacitance control voltage of the variable capacitance circuit. The temperature compensation is a process for suppressing and compensating the oscillation frequency fluctuation due to the temperature fluctuation.

For example, the temperature compensation circuit 60 performs analog temperature compensation based on polynomial approximation. For example, when the temperature compensation voltage VCP for compensating the frequency-temperature characteristics of the resonator 10 is approximated by a polynomial, the temperature compensation circuit 60 performs analog temperature compensation based on coefficient information of the polynomial. The analog temperature compensation is temperature compensation realized by, for example, an addition process of a current signal and a voltage signal which are analog signals. For example, when the temperature compensation voltage VCP is approximated by a high order polynomial, the 0th order coefficient, the 1st order coefficient, and the high order coefficient of the polynomial are stored in the storage portion 100 as 0th order correction data, 1st order correction data, and high order correction data, respectively. For example, it is stored in the storage portion 100 realized by a nonvolatile memory. The high order coefficient is, for example, a higher order coefficient larger than the 1st order, and the high order correction data is correction data corresponding to the high order coefficient. For example, when the temperature compensation voltage VCP is approximated by a 5th order polynomial, 0th order coefficient, 1st order coefficient, 2nd order coefficient, 3rd order coefficient, 4th order coefficient, and 5th order coefficient of polynomial are stored in the storage portion 100 as 0th order correction data, 1st order correction data, 2nd order correction data, 3rd order correction data, 4th order correction data and 5th order correction data. Then, the temperature compensation circuit 60 performs temperature compensation based on the 0th order correction data to the 5th order correction data. The temperature compensation based on the 2nd order correction data or the 4th order correction data may be omitted. The order of the polynomial approximation is random, and for example, 3rd order polynomial approximation may be performed, or polynomial approximation of an order larger than the 5th order may be performed. Further, the temperature sensor 70 may perform the 0th order correction. Further, without providing the temperature sensor 70 in the integrated circuit device 20, the temperature compensation circuit 60 may perform temperature compensation based on a temperature detection signal such as a temperature detection voltage input from the outside.

The control circuit 50 controls the temperature compensation circuit 60. The control circuit 50 can also control the oscillation circuit 30, the output circuit 40, the regulators 81 and 82, or the storage portion 100. For example, the control circuit 50 includes a register, and information stored in the storage portion 100 is read at the start of a normal operation of causing the resonator 10 to oscillate and outputting the clock signals CK and CKX, and the information is transferred to and stored in the register of the control circuit 50. Based on the information stored in the register, various control signals are generated and output to each circuit of the integrated circuit device 20 to control each circuit. Therefore, the noise generated by the control circuit 50 is low because the control circuit 50 does not need to operate at high speed during normal operation. The integrated circuit device 20 may have a first mode in which temperature compensation is turned on and a second mode in which temperature compensation is turned off. In this case, the control circuit 50 can perform switching control between the first mode and the second mode.

The reference voltage generation circuit 90 generates a reference voltage VREF based on the power supply voltage VDD. For example, the reference voltage VREF that is a constant voltage is generated even when there is a power supply voltage fluctuation or a temperature fluctuation. The reference voltage generation circuit 90 can be realized by, for example, a band gap reference circuit that generates a reference voltage VREF based on a band gap voltage.

The regulator 81 generates a regulated power supply voltage VREG1 based on the power supply voltage VDD. The regulator 81 is a first regulator, and the regulated power supply voltage VREG1 is a first regulated power supply voltage. For example, the regulator 81 generates the regulated power supply voltage VREG1 based on the power supply voltage VDD from the power supply pad T3 and the reference voltage VREF from the reference voltage generation circuit 90. By using the reference voltage VREF that is a constant voltage even when there is a power supply voltage fluctuation or a temperature fluctuation, it is possible to generate the regulated power supply voltage VREG1 which is a power supply voltage satisfying VDD>VREG1 and which is a constant voltage even when there is a power supply voltage fluctuation or a temperature fluctuation. Then, the regulator 81 supplies the generated regulated power supply voltage VREG1 to the temperature compensation circuit 60. Further, the regulator 81 supplies the regulated power supply voltage VREG1 to the control circuit 50. A regulator other than the regulator 81 may be provided, and the regulated power supply voltage may be supplied to the control circuit 50 by the regulator.

The regulator 82 generates a regulated power supply voltage VREG2 based on the power supply voltage VDD. The regulator 82 is a second regulator, and the regulated power supply voltage VREG2 is a second regulated power supply voltage. For example, the regulator 82 generates the regulated power supply voltage VREG2 based on the power supply voltage VDD from the power supply pad T3 and the reference voltage VREF from the reference voltage generation circuit 90. By using the reference voltage VREF that is a constant voltage even when there is a power supply voltage fluctuation or a temperature fluctuation, it is possible to generate the regulated power supply voltage VREG2 which is a power supply voltage satisfying VDD>VREG2 and which is a constant voltage even when there is a power supply voltage fluctuation or a temperature fluctuation. Then, the regulator 82 supplies the generated regulated power supply voltage VREG2 to the output circuit 40. The regulator 82 also supplies the regulated power supply voltage VREG2 to the oscillation circuit 30. A regulator other than the regulator 82 may be provided, and the regulated power supply voltage may be supplied to the oscillation circuit 30 by the regulator.

For example, the regulator 81 generates a regulated power supply voltage VREG1 which is a fixed voltage. On the other hand, the regulator 82 generates a regulated power supply voltage VREG2 whose voltage is variably set, for example. For example, the storage portion 100 stores voltage setting information, and the regulator 82 generates a regulated power supply voltage VREG2 in which the voltage is variably set based on the voltage setting information stored in the storage portion 100. As a result, the power supply voltage level of the output circuit 40 and the oscillation circuit 30 can be variably set. For example, in a model in which reduction of phase noise due to phase jitter is more important than reduction of power consumption, the regulated power supply voltage VREG2 is set to a high voltage. On the other hand, the regulated power supply voltage VREG2 is set to a low voltage in a model in which reduction of power consumption is more important than reduction of phase noise.

The pad T7 is a pad to which an external input signal EIN is input. The pad T7 is electrically coupled to the external terminal TE7 of the oscillator 4. For example, a frequency control signal, an output enable signal, or a standby signal is input as an external input signal EIN via the pad T7. The control circuit 50 performs frequency control, output enable control, or standby control process based on the frequency control signal, output enable signal, or standby signal input from the pad T7. In a test mode, a test signal for the resonator 10 may be input via the pad T7. In this case, a switch circuit for coupling the pad T7 and the signal line L1 is provided, and a test signal input from the pad T7 is input to one end of the resonator 10 via the switch circuit and the signal line L1. This makes it possible to test and inspect the resonator 10 for overdrive. Further, when the storage portion 100 is realized by a nonvolatile memory, at the time of writing information to the nonvolatile memory, a high voltage for memory writing may be input via the pad T7 and supplied to the nonvolatile memory as the storage portion 100.

The storage portion 100 is a circuit that stores various types of information and can be realized by a semiconductor memory or the like. Specifically, the storage portion 100 can be realized by a nonvolatile memory. The nonvolatile memory includes, for example, electrically erasable programmable read-only memory (EEPROM) that can electrically erase data, and one time programmable (OTP) memory using floating gate avalanche injection MOS (FAMOS), or the like can be used. Alternatively, the nonvolatile memory may be a memory using fuse cells. Then, the storage portion 100 stores voltage setting information, and the regulator 82 generates the regulated power supply voltage VREG2 in which the voltage is variably set based on the voltage setting information stored in the storage portion 100. For example, the voltage setting information is stored in the storage portion 100 realized by a nonvolatile memory or the like, and the resistance value of the variable resistor included in the regulator 82 is set based on the voltage setting information, so that the voltage of the regulated power supply voltage VREG2 is variably set. Further, when the temperature compensation circuit 60 performs temperature compensation based on polynomial approximation, the storage portion 100 realized by a nonvolatile memory or the like stores coefficient information of polynomial approximation. For example, the storage portion 100 stores the above-described 0th order correction data, 1st order correction data, and high order correction data as coefficient information for polynomial approximation. Such voltage setting information and coefficient information are written and stored in the storage portion 100 realized by a nonvolatile memory or the like when the integrated circuit device 20 or the oscillator 4 is manufactured or shipped, for example. As a result, the voltage value of the regulated power supply voltage VREG2 and the coefficient information for temperature compensation can be set according to the model of the integrated circuit device 20 and the oscillator 4.

2. Layout Arrangement

FIG. 3 shows a layout arrangement example of the integrated circuit device 20 of the present embodiment. In the layout arrangement example of FIG. 3, the circuit arrangement area of each circuit described in FIGS. 1 and 2 is shown. The circuit arrangement area is an area in which circuit elements constituting the circuit and wirings coupling the circuit elements are arranged. The circuit element is an active element such as a transistor or a passive element such as a resistor or a capacitor. In the layout arrangement examples of FIGS. 3 to 6, an arrangement example in a plan view in a direction orthogonal to a substrate at which circuit elements of the integrated circuit device 20 are formed is shown.

The integrated circuit device 20 has sides SD1, SD2, SD3, and SD4. The sides SD1, SD2, SD3, and SD4 are a first side, a second side, a third side, and a fourth side, respectively. The sides SD1, SD2, SD3, and SD4 correspond to sides of a rectangular semiconductor chip that is the integrated circuit device 20. For example, the sides SD1, SD2, SD3, and SD4 are sides of the semiconductor chip substrate. The semiconductor chip is also called a silicon die. The side SD2 is a side that intersects the side SD1. Here, the intersection is, for example, orthogonal. The side SD3 is the opposite side of the side SD1. The side SD4 is the opposite side of the side SD2. The side SD1 and the side SD3 intersect with the side SD2 and the side SD4. Here, the direction from the side SD1 to the side SD3 is DR1, and the direction from the side SD2 to the side SD4 is DR2. The direction opposite to the direction DR1 is defined as a direction DR3, and the direction opposite to the direction DR2 is defined as a direction DR4. The directions DR1, DR2, DR3 and DR4 are a first direction, a second direction, a third direction, and a fourth direction, respectively. In FIG. 3, CN1 is a corner portion where the side SD2 and the side SD3 intersect each other, and CN2 is a corner portion where the side SD1 and the side SD4 intersect each other. The corner portions CN1 and CN2 are opposite corner portions. CN3 is a corner portion where the side SD1 and the side SD2 intersect each other, and CN4 is a corner portion where the side SD3 and the side SD4 intersect each other. The corner portions CN3 and CN4 are opposite corner portions.

The integrated circuit device 20 of the present embodiment includes, as shown in FIGS. 1, 2 and 3, the pads T1 and T2 electrically coupled to the resonator 10, the oscillation circuit 30 that is electrically coupled to the pads T1 and T2, and generates the oscillation signal OSC by causing the resonator 10 to oscillate, and the output circuit 40 that outputs the clock signals CK and CKX based on the oscillation signal OSC. As shown in FIG. 3, the oscillation circuit 30 is disposed along the side SD1 of the integrated circuit device 20. For example, the oscillation circuit 30 is disposed such that the side of the oscillation circuit 30 on the side SD1 side is along the side SD1 of the integrated circuit device 20. For example, the side along the longitudinal direction of the oscillation circuit 30 is disposed along the side SD1.

For example, the circuit being disposed along the side of the integrated circuit device 20 means that the circuit is disposed such that no other circuit exists between the circuit and the side. For example, a circuit is disposed in an area having a predetermined width from the side. In addition, when another circuit is located in a direction opposite to the direction toward the side, the circuit is disposed between the another circuit and the side.

The pads T1 and T2 are disposed along the side SD1 of the integrated circuit device 20. Specifically, the pads T1 and T2 are disposed in the oscillation circuit 30 along the side SD1 in a plan view. For example, the pads T1 and T2 are disposed in the circuit arrangement area of the oscillation circuit 30 in a plan view in a direction orthogonal to the substrate at which the circuit elements are formed. For example, in the circuit arrangement area of the oscillation circuit 30, the pads T1 and T2 are disposed along the direction DR2 at a position close to the side SD1.

For example, the pad being disposed along the side of the integrated circuit device 20 means that the pad is disposed such that no other pad exists between the pad and the side. For example, pads are disposed in an area having a predetermined width from the side.

The output circuit 40 is disposed along the side SD2 of the integrated circuit device 20. For example, the output circuit 40 is disposed such that the side at the side SD2 side of the output circuit 40 is along the side SD2 of the integrated circuit device 20. For example, the side along the longitudinal direction of the output circuit 40 is disposed along the side SD2. In other words, the oscillation circuit 30 is disposed in an area near the side SD1, and the output circuit 40 is disposed in an area near the side SD2.

The resonator coupling pads T1 and T2 are coupled to the oscillation circuit 30 via signal lines L1 and L2, as shown in FIGS. 1 and 2. Accordingly, when the distance between the pads T1 and T2 is increased, the wiring length of the signal lines L1 and L2 coupling the pads T1 and T2 and the oscillation circuit 30 is increased. When the wiring length of the signal lines L1 and L2 is increased as described above, problems such as increase in parasitic resistance and parasitic capacitance of the signal lines L1 and L2 and deterioration of the oscillation characteristics of the resonator 10 occur. For example, problems such as deterioration of negative resistance and decrease in oscillation amplitude occur.

In this respect, in FIG. 3, the oscillation circuit 30 is disposed along the side SD1, and the pads T1 and T2 are also disposed along the side SD1. That is, the oscillation circuit 30 and the pads T1 and T2 are both disposed at a position close to the side SD1. More specifically, the pads T1 and T2 are disposed in the circuit arrangement area of the oscillation circuit 30. Accordingly, the pads T1 and T2 and the oscillation circuit 30 can be coupled by a short path, and the wiring length of the signal lines L1 and L2 can be shortened. Specifically, the pads T1 and T2 are coupled to a drive circuit 32 that is a core circuit of the oscillation circuit 30 shown in FIG. 7 described later. According to the present embodiment, the wiring length of the signal lines L1 and L2 coupling the pads T1 and T2 and the drive circuit 32 can be shortened. As an example, in FIG. 3, the drive circuit 32 is disposed between the pad T1 and the pad T2. For example, the drive circuit 32 of the oscillation circuit 30 is disposed in the direction DR2 of the pad T1 and in the direction DR4 of the pad T2. That is, the drive circuit 32 of the oscillation circuit 30 and the pads T1 and T2 are disposed in the circuit arrangement area of the oscillation circuit 30 in a plan view, and are disposed adjacent to each other in the circuit arrangement area. Therefore, the pads T1 and T2 and the drive circuit 32 can be coupled by a short path. By coupling the pads T1 and T2 and the drive circuit 32 with a short path in this way, the wiring length of the signal lines L1 and L2 is shortened, and the parasitic resistance and parasitic capacitance of the signal lines L1 and L2 can be reduced. Accordingly, it is possible to prevent the deterioration of the oscillation characteristics due to the increase in the wiring length of the signal lines L1 and L2. Further, if the pads T1 and T2 are disposed in the oscillation circuit 30, since the pads T1 and T2 can be disposed effectively using the circuit arrangement area of the oscillation circuit 30 without separately providing the pad arrangement areas for the pads T1 and T2, an efficient layout arrangement is possible.

In FIG. 3, the oscillation circuit 30 is disposed along the side SD1, and the output circuit 40 is disposed along the side SD2 that intersects the side SD1. Accordingly, the distance between the oscillation circuit 30 and the output circuit 40 can be reduced, and signal propagation with a shortened high frequency signal path is possible.

For example, when the resonator 10 is caused to oscillate at a high oscillation frequency such as 100 MHz or higher, the frequency of the oscillation signal OSC and the clock signals CK and CKX output from the oscillation circuit 30 also increase. When a high frequency signal, which is a signal with a high frequency, propagates through a signal line having a long wiring length, a large radiation noise is generated from the signal line. Further, a signal line having a long wiring length may adversely affect the characteristics of the oscillation signal OSC.

In this respect, in FIG. 3, by disposing the oscillation circuit 30 along the side SD1 and disposing the output circuit 40 along the side SD2, the oscillation circuit 30 and the output circuit 40 can be coupled with a short path. Therefore, the wiring length of the signal line through which the high frequency signal propagates can be shortened, and radiation noise generated from the signal line can be reduced. Further, since the wiring length of the signal line through which the high frequency signal propagates is shortened, it is possible to reduce the adverse effect of the parasitic resistance and parasitic capacitance of the signal line on the characteristics of the oscillation signal.

The oscillation circuit 30 is disposed in the vicinity of the side SD1, and the output circuit 40 is disposed in the vicinity of the side SD2 so that an area on the direction DR1 side of the oscillation circuit 30 and on the direction DR2 side of the output circuit 40 can be used as an arrangement area of the temperature compensation circuit 60 and the control circuit 50, for example. Therefore, an efficient layout arrangement of the circuit blocks of the integrated circuit device 20 is possible, and the circuit area can be reduced, so that reduction in the size of the integrated circuit device 20 can be achieved.

Since the output circuit 40 performs buffering and driving for a high frequency signal, it becomes a noise source that generates a large amount of noise and a heat source that generates a high temperature. In FIG. 3, such an output circuit 40 serving as a noise source and a heat source is disposed along the side SD2. Therefore, since the output circuit 40 can be disposed close to the side SD2, for example, a circuit that is desired to be away from the noise source or the heat source can be disposed, for example, at the side SD4 which is an opposite side of the side SD2. For example, by disposing the temperature sensor 70 on the side SD4 side that is the opposite side of the side SD2 where the output circuit 40 is disposed, it is possible to reduce the adverse effect of the heat from the output circuit 40 on the temperature detection in the temperature sensor 70. As a result, it is possible to achieve high accuracy of temperature compensation of the temperature compensation circuit 60 and the like. Further, by disposing the reference voltage generation circuit 90 on the side SD4 side, it is possible to reduce the adverse effect of noise from the output circuit 40 on the generation of the reference voltage VREF in the reference voltage generation circuit 90. For example, when the reference voltage VREF generated by the reference voltage generation circuit 90 fluctuates due to noise from the output circuit 40, the regulated power supply voltages VREG1 and VREG2 generated by the regulators 81 and 82 also fluctuates. As a result, problems such as adverse effects on the temperature compensation of the temperature compensation circuit 60 and the oscillation operation of the oscillation circuit 30 and an increase in phase noise occur. By disposing the output circuit 40 along the side SD2, it is possible to increase the distance between the output circuit 40 and the reference voltage generation circuit 90, and to prevent such a problem from occurring.

In FIG. 3, the output circuit 40 is disposed at the corner portion CN1 where the side SD2 and the side SD3 of the integrated circuit device 20 intersect each other. For example, the output circuit 40 is disposed such that the first side of the output circuit 40 is along the side SD2 of the integrated circuit device 20 and the second side of the output circuit 40 is along the side SD3 of the integrated circuit device 20. That is, the output circuit 40 is disposed such that the position of the corner portion where the first side and the second side of the output circuit 40 intersect each other is the position of the corner portion CN1 of the integrated circuit device 20.

In this way, since the output circuit 40 can be disposed close to the corner portion CN1 of the integrated circuit device 20, a compact and efficient layout arrangement is possible, and reduction in the size of the integrated circuit device 20 can be achieved. Further, as described above, the output circuit 40 performs buffering and driving for high frequency signals, so that it becomes a noise source that generates a large amount of noise and a heat source that generates a high temperature. In this respect, in FIG. 3, since the output circuit 40 is disposed at the corner portion CN1, for example, the temperature sensor 70 can be disposed at the corner portion CN2 facing the corner portion CN1 where the output circuit 40 is disposed. Accordingly, the distance between the output circuit 40 and the temperature sensor 70 can be maximized, and it is possible to prevent the heat from the output circuit 40 from adversely affecting the temperature detection result of the temperature sensor 70 and deteriorating the accuracy of temperature compensation. Further, the reference voltage generation circuit 90 can be disposed near a corner portion CN4 different from the corner portion CN1 where the output circuit 40 is disposed. Therefore, the distance between the output circuit 40 and the reference voltage generation circuit 90 can be increased, and it is possible to prevent the noise from the output circuit 40 from adversely affecting the generation of the reference voltage VREF and causing problems such as an increase in phase noise.

The integrated circuit device 20 includes the temperature compensation circuit 60 that performs temperature compensation of the oscillation frequency of the oscillation circuit 30 based on the temperature detection voltage VT from the temperature sensor 70. When the direction from the side SD1 to the side SD3 is DR1, and the direction from the side SD2 to the side SD4 is DR2, the temperature compensation circuit 60 is disposed in the direction DR1 of the oscillation circuit 30 and in the direction DR2 of the output circuit 40. That is, the temperature compensation circuit 60 is disposed in the circuit arrangement area on the direction DR1 side of the oscillation circuit 30 and in the circuit arrangement area on the direction DR2 side of the output circuit 40.

In this way, the temperature compensation circuit 60 can be disposed effectively using the space in the direction DR1 of the oscillation circuit 30 and in the direction DR2 of the output circuit 40. For example, since the temperature compensation circuit 60 is a circuit that performs analog temperature compensation based on polynomial approximation, the circuit area increases. In this respect, since the area on the direction DR1 side of the oscillation circuit 30 disposed along the side SD1 and on the direction DR2 side of the output circuit 40 disposed along the side SD2 is an empty space, an efficient layout arrangement is possible by disposing the temperature compensation circuit 60 having a large circuit area in this space. As a result, the area of the integrated circuit device 20 can be reduced. Further, by disposing the temperature compensation circuit 60 in the direction DR1 of the oscillation circuit 30, the temperature compensation voltage VCP from the temperature compensation circuit 60 can be input to the oscillation circuit 30 through a short path so that the oscillation frequency can be controlled.

The integrated circuit device 20 includes the control circuit 50 that controls the temperature compensation circuit 60. The control circuit 50 is disposed in the direction DR2 of the temperature compensation circuit 60. In other words, the temperature compensation circuit 60 is disposed between the output circuit 40 and the control circuit 50. The control circuit 50 is disposed along the side SD4, for example. For example, the output circuit 40 is disposed between the temperature compensation circuit 60 and the side SD2, and the control circuit 50 is disposed between the temperature compensation circuit 60 and the side SD4. Further, the oscillation circuit 30 is disposed between the temperature compensation circuit 60 and the side SD1. That is, with the temperature compensation circuit 60 as the center, the oscillation circuit 30 is disposed in the direction of the side SD1, the output circuit 40 is disposed in the direction of the side SD2, and the control circuit 50 is disposed in the direction of the side SD4.

If the control circuit 50 is disposed in this way, the control circuit 50 for controlling the temperature compensation circuit 60 can be disposed, for example, adjacent to the temperature compensation circuit 60 in the direction DR2 of the temperature compensation circuit 60. Therefore, the control signal from the control circuit 50 can be input to the temperature compensation circuit 60 through a short path. Further, when the oscillation circuit 30 is disposed along the side SD1 and the output circuit 40 is disposed along the side SD2, effectively using the space along the side SD4, the control circuit 50 can be disposed by, for example, automatic placement and routing, and efficient layout arrangement becomes possible. As a result, the integrated circuit device 20 can be reduced in size. Further, when the pad T7 to which the external input signal EIN is input is disposed along the side SD4, the control circuit 50 can be disposed near the pad T7. Therefore, the external input signal EIN such as a frequency control signal, an output enable signal, or a standby signal can be input to the control circuit 50 through a short path.

The integrated circuit device 20 includes the temperature compensation circuit 60 that performs temperature compensation of the oscillation frequency, and the regulator 81 that supplies the regulated power supply voltage VREG1 to the temperature compensation circuit 60. The regulator 81 is disposed in the direction DR1 of the temperature compensation circuit 60. Specifically, the regulator 81 is disposed along the side SD3. For example, the regulator 81 is disposed between the temperature compensation circuit 60 and the side SD3. In this way, the regulated power supply voltage VREG1 generated by the regulator 81 can be input to the temperature compensation circuit 60 through a short path, and the parasitic resistance and parasitic capacitance of the power supply line for supplying the regulated power supply voltage VREG1 can be reduced. Therefore, it is possible to suppress fluctuation of the regulated power supply voltage VREG1 stabilized by the regulator 81 due to the influence of noise or the like. As a result, it is possible to prevent such a situation that the regulated power supply voltage VREG1 fluctuates, the temperature compensation accuracy of the temperature compensation circuit 60 is deteriorated, and the clock frequency accuracy is lowered.

The integrated circuit device 20 includes the reference voltage generation circuit 90 that supplies the reference voltage VREF to the regulator 81 and the ground pad T4 that is supplied with a ground voltage. The reference voltage generation circuit 90 is disposed between the ground pad T4 and the regulator 81. For example, the reference voltage generation circuit 90 is disposed in the direction DR2 of the regulator 81, and the ground pad T4 is disposed in the direction DR2 of the reference voltage generation circuit 90. Specifically, the reference voltage generation circuit 90 is disposed adjacent to the regulator 81, and the ground pad T4 is disposed adjacent to the reference voltage generation circuit 90. For example, the regulator 81, the reference voltage generation circuit 90, and the ground pad T4 are disposed along the side SD3, and the ground pad T4 is disposed, for example, at the corner portion CN4 of the integrated circuit device 20.

According to such an arrangement, the distance between the ground pad T4 and the reference voltage generation circuit 90 and the distance between the reference voltage generation circuit 90 and the regulator 81 can be shortened. Accordingly, the ground voltage from the ground pad T4 can be supplied to the reference voltage generation circuit 90 through a short path. Further, the reference voltage VREF generated by the reference voltage generation circuit 90 can be supplied to the regulator 81 through a short path. As a result, the reference voltage generation circuit 90 can generate the reference voltage VREF with reference to the ground voltage having a stable potential, so that the reference voltage VREF having a stable potential can be supplied to the regulator 81 and the like.

Further, the regulator 81 can generate the regulated power supply voltage VREG1 based on the reference voltage VREF having a stable potential, so that the regulated power supply voltage VREG1 having a stable potential can be supplied to the temperature compensation circuit 60 and the like. As a result, it is possible to effectively prevent the occurrence of such a situation that the accuracy of the temperature compensation in the temperature compensation circuit 60 deteriorates due to the fluctuation of the regulated power supply voltage VREG1 and the accuracy of the clock frequency decreases.

The integrated circuit device 20 includes the temperature sensor 70 and the temperature compensation circuit 60 that performs temperature compensation based on the temperature detection voltage VT from the temperature sensor 70. The temperature sensor 70 is disposed in the direction DR2 of the oscillation circuit 30. For example, the temperature sensor 70 is disposed between the oscillation circuit 30 and the side SD4. Specifically, the temperature sensor 70 is disposed adjacent to the oscillation circuit 30 on the direction DR2 side of the oscillation circuit 30.

In this way, the distance between the pad T2 disposed in the oscillation circuit 30 and the temperature sensor 70 can be reduced. For example, the temperature sensor 70 can be disposed adjacent to the pad T2. In addition, the distance between the pad T1 disposed in the oscillation circuit 30 and the temperature sensor 70 can be reduced. For example, the temperature sensor 70 ideally detects the temperature itself of the resonator 10. However, in FIG. 3, since the temperature sensor 70 is incorporated in the integrated circuit device 20, the temperature of the resonator 10 cannot be directly detected in the immediate vicinity of the resonator 10. In this respect, the pad T2 and the resonator 10 are electrically coupled using an internal wiring of the package, a bonding wire, a metal bump, or the like, and the internal wiring, the bonding wire, and the metal bump are formed of metal. Therefore, the temperature of the resonator 10 is thermally conducted by the metal and transmitted to the pad T2. Therefore, by disposing the temperature sensor 70 near the pad T2, the temperature of the resonator 10 can be detected more appropriately using the temperature sensor 70. As a result, the accuracy of temperature detection can be improved, the accuracy of temperature compensation can be improved, and high accuracy of the clock frequency can be achieved. Further, since the temperature sensor 70 is disposed on the direction DR2 side of the oscillation circuit 30, the distance between the output circuit 40 disposed along the side SD2 and the temperature sensor 70 can be increased. Therefore, it is possible to prevent a situation in which the heat from the output circuit 40 adversely affects the temperature detection result of the temperature sensor 70 and the temperature compensation accuracy is deteriorated, and to achieve a high accuracy of the clock frequency.

In FIG. 3, the temperature sensor 70 is disposed at a corner portion CN2 where the side SD1 and the side SD4 of the integrated circuit device 20 intersect each other. Specifically, the temperature sensor 70 is disposed such that, for example, the short side of the temperature sensor 70 is along the side SD1, and the long side of the temperature sensor 70 is along the side SD4. For example, the temperature sensor 70 is disposed at a position closest to the corner portion CN2. In this way, the temperature sensor 70 can be disposed at a position away from the output circuit 40 disposed along the side SD2. For example, when the output circuit 40 is disposed at the corner portion CN1, the temperature sensor 70 can be disposed at the corner portion CN2 facing the corner portion CN1. Thereby, the distance between the output circuit 40 and the temperature sensor 70 can be maximized. Therefore, it is possible to prevent a situation in which the heat from the output circuit 40 adversely affects the temperature detection result of the temperature sensor 70 and the temperature compensation accuracy is deteriorated, and to achieve a high accuracy of the clock frequency.

The integrated circuit device 20 includes the clock pads T5 and T6 that output the clock signals CK and CKX. The clock pads T5 and T6 are disposed in the output circuit 40. For example, the clock pads T5 and T6 are disposed in the circuit arrangement area of the output circuit 40 in plan view. For example, the clock pads T5 and T6 are disposed along the direction DR1 at a position close to the side SD2 in the circuit arrangement area of the output circuit 40. For example, the clock pad T5 is disposed at the corner portion CN1 of the integrated circuit device 20.

If the clock pads T5 and T6 are disposed in the output circuit 40 in this way, since it is possible to arrange the clock pads T5 and T6 effectively using the circuit arrangement area of the output circuit 40 without separately providing pad arrangement areas for the clock pads T5 and T6, an efficient layout arrangement is possible. Further, the oscillation signal OSC from the oscillation circuit 30 disposed along the side SD1 is input to the output circuit 40 disposed along the side SD2, and the output circuit 40 can output the clock signals CK and CKX based on the oscillation signal OSC via the clock pads T5 and T6 provided in the output circuit 40. Accordingly, since the high frequency signal is propagated through the short path signal path, the generation of radiation noise can be reduced.

The integrated circuit device 20 includes the power pad T3 and the ground pad T4. The power supply pad T3 is disposed along the side SD2, and the ground pad T4 is disposed along the side SD4. For example, the power supply pad T3 is disposed near the center of the side SD2, and is disposed between the regulator 82 and the output circuit 40, for example. The ground pad T4 is disposed in the vicinity of the end of the side SD4, and specifically, is disposed at the corner portion CN4 where the side SD4 and the side SD3 intersect each other.

For example, in the output circuit 40, as will be described later with reference to FIG. 8, a final-stage output driver 46 operates based on the power supply voltage VDD and outputs the clock signals CK and CKX. For example, the output driver 46 consumes a large amount of current because it performs current driving using the current from VDD. For this reason, a large amount of current flows through the VDD power supply line. In this respect, by disposing the power supply pad T3 along the side SD2, the power supply pad T3 is disposed near the output circuit 40 disposed along the side SD2. Since the power supply pad T3 is disposed near the output circuit 40, the power supply line from the power supply pad T3 can be coupled to the output circuit 40 through a short path. Therefore, even when a large amount of current flows through the VDD power supply line by driving the output driver 46 of the output circuit 40, a voltage drop or the like can be minimized, and a current can be appropriately supplied from the power supply pad T3 disposed near the output circuit 40. Further, since the ground pad T4 is disposed along the side SD4, the ground voltage can be supplied with a low impedance to the reference voltage generation circuit 90 and the like disposed near the side SD4, and generation of an appropriate reference voltage VREF can be achieved.

The oscillation circuit 30 is disposed in the direction along the side SD1 as the longitudinal direction. For example, the oscillation circuit 30 is disposed such that the long side of the oscillation circuit 30 is along the direction DR2 that is the direction along the side SD1. In this way, the direction of the short side of the oscillation circuit 30 is a direction that intersects the direction DR2 along the side SD1. That is, the direction of the short side of the oscillation circuit 30 is the direction DR1. Accordingly, the oscillation circuit 30 is disposed in an area having a predetermined width from the side SD1. That is, the oscillation circuit 30 can be disposed in an area having a predetermined width corresponding to the length of the short side of the oscillation circuit 30 from the side SD1, and an efficient layout arrangement is possible.

The output circuit 40 is disposed in the direction along the side SD2 as the longitudinal direction. For example, the output circuit 40 is disposed such that the long side of the output circuit 40 is along the direction DR1 that is the direction along the side SD2. In this way, the direction of the short side of the output circuit 40 is a direction that intersects the direction DR1 along the side SD2. That is, the direction of the short side of the output circuit 40 is the direction DR2. Accordingly, the output circuit 40 is disposed in an area having a predetermined width from the side SD2. That is, the output circuit 40 can be disposed in an area having a predetermined width corresponding to the length of the short side of the output circuit 40 from the side SD2, and an efficient layout arrangement is possible.

FIG. 4 is a schematic diagram showing a current path in the integrated circuit device 20. In FIG. 4, the thickness of the arrow schematically represents the magnitude of the flowing current.

For example, a current IV2 flows from the power supply pad T3 to the regulator 82 that supplies the regulated power supply voltage VREG2 to the output circuit 40 and the oscillation circuit 30. A current IV1 flows from the power supply pad T3 to the regulator 81 that supplies the regulated power supply voltage VREG1 to the temperature compensation circuit 60 and the control circuit 50. The relationship IV2>IV1 is established. Further, a current IV3 flows from the power supply pad T3 to the output circuit 40, and IV3>IV1 is satisfied. That is, since a large amount of current is consumed for high frequency oscillation operation and high frequency signal buffering and driving, the current IV2 flowing from the power supply pad T3 to the regulator 82 increases, and currents IB1 and IB2 flowing from the regulator 82 to the output circuit 40 and the oscillation circuit 30 also increase. Further, in the output circuit 40, since a large amount of current flows in the output driver 46 as shown in FIG. 8 described later, the current IV3 flowing from the power supply pad T3 to the output circuit 40 also increases. Therefore, in the present embodiment, the regulator 82, the output circuit 40, and the oscillation circuit 30 are disposed near the power supply pad T3. For example, the regulator 82, the power supply pad T3, and the output circuit 40 are disposed along the side SD2. The oscillation circuit 30 is disposed in the direction DR2 of the regulator 82. As a result, the parasitic resistance in the path through which the current flows can be reduced, and the current can be supplied with a low impedance.

As shown in FIG. 4, the power supply voltage VDD from the power supply pad T3 is supplied to the regulator 81 via the power supply line LPW1 and is supplied to the regulator 82 via the power supply line LPW2. LPW1 is a first power supply line, and LPW2 is a second power supply line. Currents IA1 and IA2 flow from the regulator 81 to the temperature compensation circuit 60 and the control circuit 50 based on the power supply voltage VDD supplied via the power supply line LPW1.

The currents IB1 and IB2 flow from the regulator 82 to the output circuit 40 and the oscillation circuit 30 based on the power supply voltage VDD supplied via the power supply line LPW2. As described above, in FIG. 4, the power supply voltage VDD from the power supply pad T3 is supplied to the regulators 81 and 82 via the separate power supply lines LPW1 and LPW2, respectively.

At this time, in the present embodiment, a wiring width WP1 of the power supply line LPW1 coupling the power supply pad T3 and the regulator 81 is made narrower than a wiring width WP2 of the power supply line LPW2 coupling the power supply pad T3 and the regulator 82. That is, while the wiring width WP2 of the power supply line LPW2 coupled to the regulator 82 is increased, the wiring width WP1 of the power supply line LPW1 coupled to the regulator 81 is decreased. Then, by increasing the wiring width WP2 of the power supply line LPW2, a large current from the power supply pad T3 can be supplied to the regulator 82 with low impedance. On the other hand, by reducing the wiring width WP1 of the power supply line LPW1, the impedance in the power supply line LPW1 becomes higher than the impedance in the power supply line LPW2. By performing such impedance separation, noise on the power supply line LPW2 side through which a large current flows is not transmitted to the power supply line LPW1 side, and noise of the power supply voltage VDD supplied to the regulator 81 can be reduced. As a result, the operation of the temperature compensation circuit 60 with a low noise power supply becomes possible, and deterioration of the accuracy of temperature compensation caused by power supply noise can be suppressed. That is, a large current flows from the power supply pad T3 to the regulator 82, and the generated noise increases. Then, by reducing the wiring width WP1 of the power supply line LPW1 coupled to the regulator 81, the impedance of the power supply line LPW1 is increased, and transmission of power supply noise generated on the regulator 82 side to the regulator 81 is suppressed. Since the current flowing from the regulator 81 to the temperature compensation circuit 60 and the control circuit 50 is a small current, even if the impedance of the power supply line LPW1 is increased, no significant problem occurs. Since the power supply noise on the regulator 82 side is not transmitted to the regulator 81 side, the regulated power supply voltage VREG1 supplied to the temperature compensation circuit 60 by the regulator 81 also becomes low noise, and it becomes possible to prevent deterioration of temperature compensation accuracy caused by power supply noise. The wiring width WP1 of the power supply line LPW1 and the wiring width WP2 of the power supply line LPW2 are not necessarily uniform. In this case, it is only necessary that the average value of the wiring width WP1 is smaller than the average value of the wiring width WP2.

As shown in FIG. 4, currents IG1, IG2, IG3, and IG4 flow from the reference voltage generation circuit 90, the temperature compensation circuit 60, the output circuit 40, and the oscillation circuit 30 to the ground pad T4, respectively. Since the reference voltage generation circuit 90 generates the reference voltage VREF based on the ground voltage, if the ground voltage fluctuates due to power supply noise or the like, the reference voltage VREF also fluctuates. If the reference voltage VREF fluctuates in this way, the accuracy of temperature compensation in the temperature compensation circuit 60 also deteriorates. For example, the regulator 81 generates the regulated power supply voltage VREG1 based on the reference voltage VREF from the reference voltage generation circuit 90. When the reference voltage VREF fluctuates, the regulated power supply voltage VREG1 also fluctuates. As a result, the temperature compensation accuracy of the temperature compensation circuit 60 that operates based on the regulated power supply voltage VREG1 also deteriorates. Further, the reference current used by the analog circuit is generated based on the reference voltage VREF. Therefore, when the reference voltage VREF fluctuates and the reference current fluctuates, the accuracy of the temperature compensation in the temperature compensation circuit 60 that performs analog temperature compensation based on polynomial approximation also deteriorates.

In this respect, in the present embodiment, the reference voltage generation circuit 90 is disposed closer to the ground pad T4 than other circuits. For example, the reference voltage generation circuit 90 is disposed between the ground pad T4 and the regulator 81. For example, the reference voltage generation circuit 90 is disposed adjacent to the ground pad T4. Therefore, the wiring length of the ground power supply line coupling the ground pad T4 and the reference voltage generation circuit 90 can be shortened, and the impedance in the path of the power supply line can be reduced. Therefore, since the fluctuation of the ground voltage in the reference voltage generation circuit 90 can be reduced, and the low noise reference voltage VREF can be generated, the highly accurate temperature compensation of the temperature compensation circuit 60 can be achieved.

Figure 5:
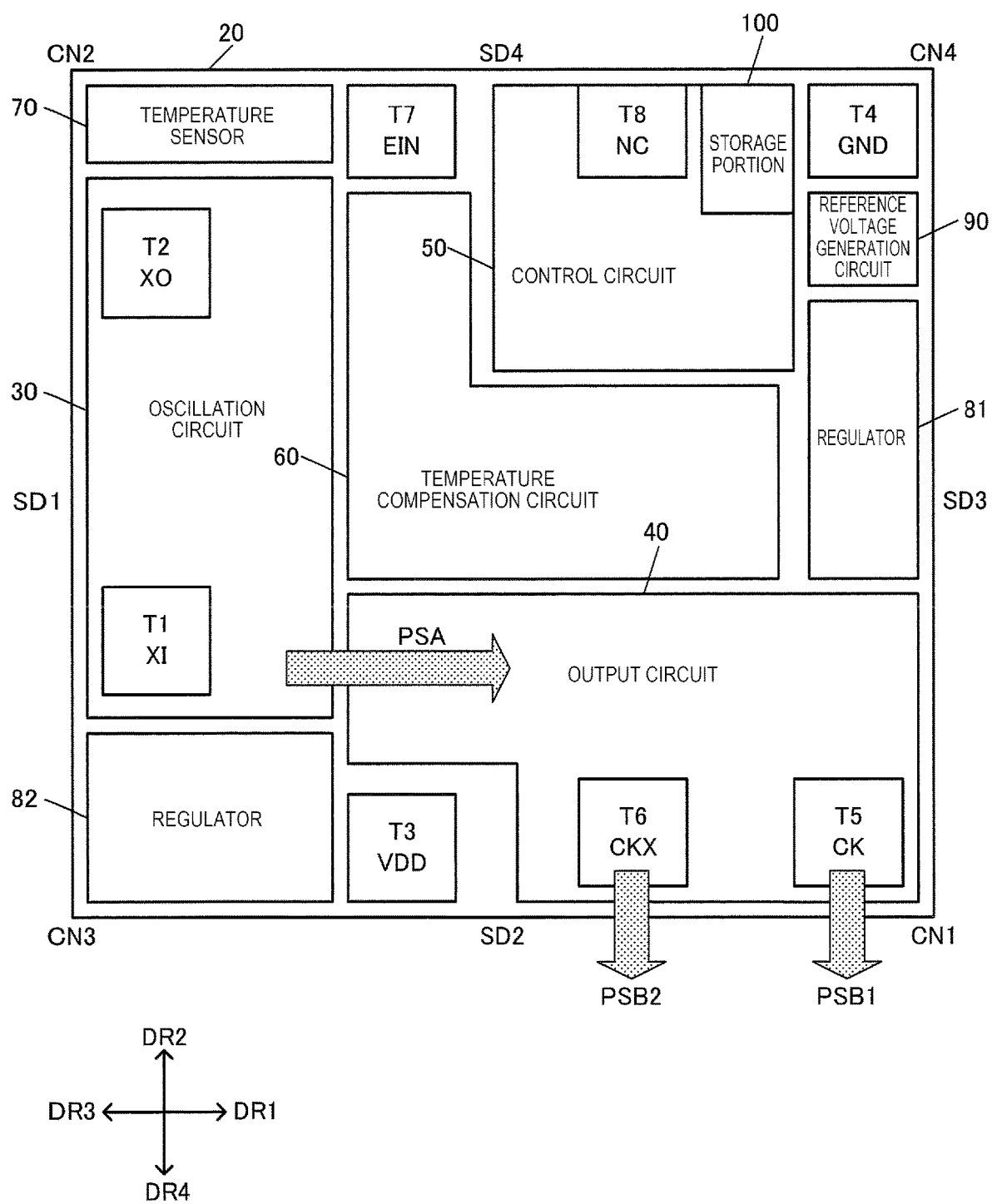
FIG. 5 is a schematic diagram showing a signal path of a high frequency signal in the integrated circuit device.

FIG. 5 is a diagram schematically showing a signal path of a high frequency signal in the integrated circuit device 20. The high frequency oscillation signal OSC generated by the oscillation circuit 30 is input to the output circuit 40 through a path indicated by PSA in FIG. 5. The clock signals CK and CKX generated based on the oscillation signal OSC are output from the clock pads T5 and T6 through paths indicated by PSB1 and PSB2. In the present embodiment, the oscillation circuit 30 is disposed along the side SD1 and the output circuit 40 is disposed along the side SD2, so that, the high frequency signal can be transmitted through the short path as shown in FIG. 5 and the clock signals CK and CKX can be output from the clock pads T5 and T6. Accordingly, the high frequency signal is transmitted through a short path, and generation of radiation noise caused by the high frequency signal can be suppressed.

FIG. 6 shows another layout arrangement example of the integrated circuit device 20. The integrated circuit device 20 of FIG. 6 includes the oscillation circuit 30, the output circuit 40, the control circuit 50, the temperature compensation circuit 60, the temperature sensor 70, and the power supply circuit 80. Further, the integrated circuit device 20 includes resonator coupling pads T1 and T2, the power supply pad T3, the ground pad T4, the clock pad T5, and the external input signal pad T7. FIG. 6 shows a configuration in which the temperature compensation circuit 60 and the temperature sensor 70 are further provided in the configuration of FIG. 1. The clock signal CK is output from the clock pad T5 not in a differential signal format but in, for example, a single-ended CMOS or clipped sine wave signal format.

Also in the integrated circuit device 20 of FIG. 6, the oscillation circuit 30 is disposed along the side SD1, and the pads T1 and T2 are disposed in the oscillation circuit 30 along the side SD1. The output circuit 40 is disposed along the side SD2. For example, the oscillation circuit 30 is disposed in the direction along the side SD1 as the longitudinal direction, and the output circuit 40 is disposed with the direction along the side SD2 as the longitudinal direction. The temperature compensation circuit 60 is disposed in the direction DR1 of the oscillation circuit 30 and in the direction DR2 of the output circuit 40. The control circuit 50 is disposed in the direction DR2 of the temperature compensation circuit 60. The power supply circuit 80 is disposed in the direction DR1 of the temperature compensation circuit 60. For example, the power supply circuit 80 is disposed in the direction DR2 of the output circuit 40. Further, the temperature sensor 70 is disposed in the direction DR2 of the oscillation circuit 30. Specifically, the temperature sensor 70 is disposed at a corner portion CN2 where the side SD1 and the side SD4 intersect each other. The clock pad T5 for outputting the clock signal CK is disposed in the output circuit 40. For example, the clock pad T5 is disposed at the corner portion CN1 where the side SD2 and the side SD3 intersect each other. The power supply pad T3 is disposed along the side SD2, and the ground pad T4 is disposed along the side SD4. For example, the power supply pad T3 is disposed in an area in the vicinity of the center portion of the side SD2, and the ground pad T4 is disposed at the corner portion CN4 where the side SD4 and the side SD3 intersect each other.

3. Oscillation Circuit

Figure 7:
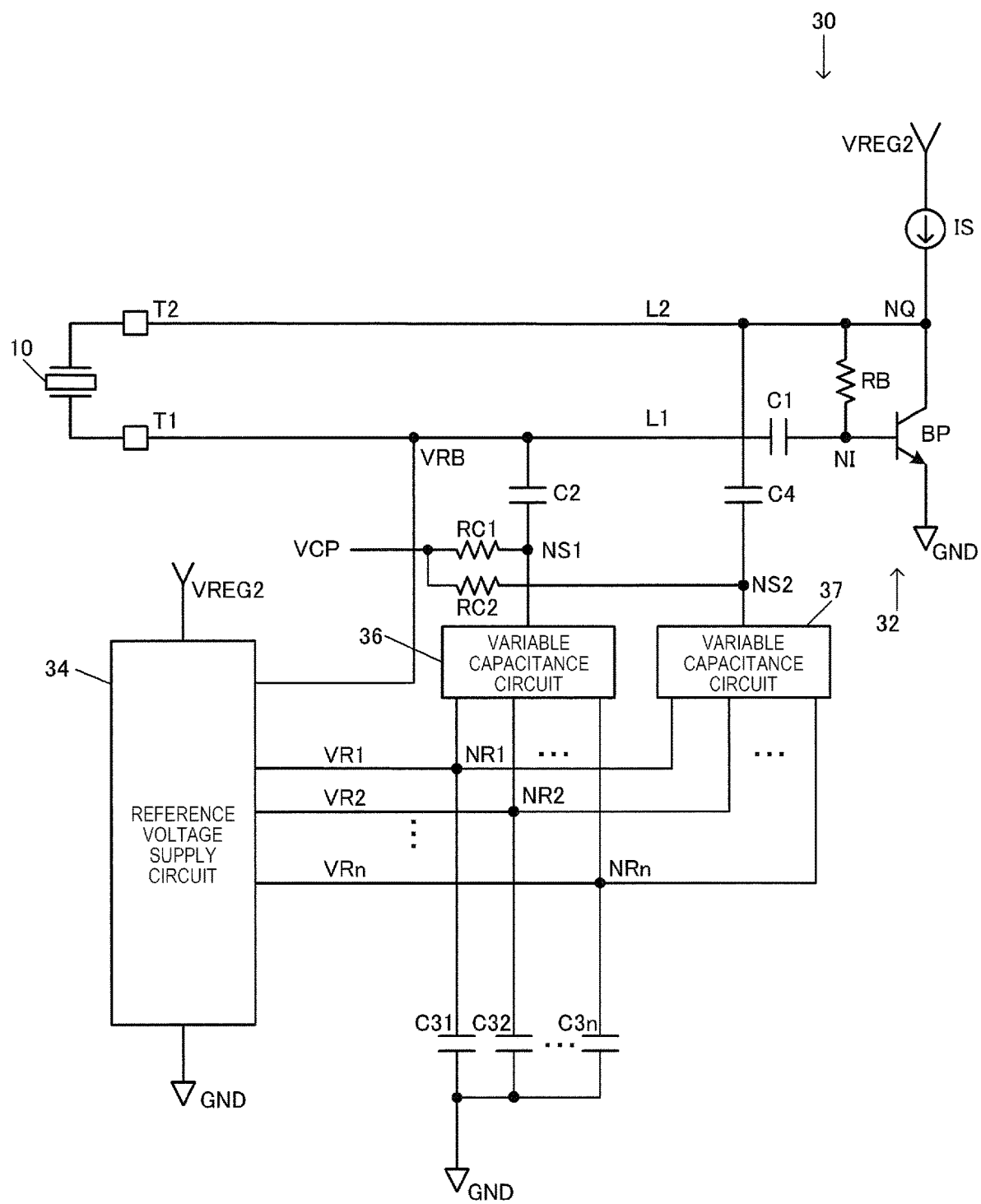
FIG. 7 is a configuration example of an oscillation circuit.

FIG. 7 is a configuration example of the oscillation circuit 30. The oscillation circuit 30 of FIG. 7 includes the drive circuit 32, DC cut capacitors C1 and C2, a reference voltage supply circuit 34, and a variable capacitance circuit 36. Further, the oscillation circuit 30 can include a DC cut capacitor C4 and a variable capacitance circuit 37. The capacitor C4 and the variable capacitance circuit 37 are not indispensable constituent elements, and a modification without providing them is possible. Further, capacitors C31 to C3$n$ are provided between the variable capacitance circuit 36 and the variable capacitance circuit 37 and the GND node.

The drive circuit 32 is a circuit that drives and causes the resonator 10 to oscillate. The drive circuit 32 includes a current source IS, a bipolar transistor BP, and a resistor RB. The current source IS is provided between the power supply node of VREG2 and the bipolar transistor BP, and supplies a constant current to the bipolar transistor BP. The bipolar transistor BP is a transistor that drives the resonator 10. The base node is an input node NI of the drive circuit 32, and the collector node is an output node NQ of the drive circuit 32. The resistor RB is provided between the collector node and the base node of the bipolar transistor BP.

The DC cut capacitor C1 is provided between the input node NI of the drive circuit 32 and the signal line L1. By providing such a capacitor C1, the DC component of the oscillation signal is cut, and only the AC component is transmitted to the input node NI of the drive circuit 32, so that the bipolar transistor BP can be appropriately operated. The DC cut capacitor C1 may be provided between the output node NQ of the drive circuit 32 and the signal line L1.

The reference voltage supply circuit 34 supplies the reference voltages VR1 to VRn to the variable capacitance circuit 36 and the variable capacitance circuit 37. The reference voltage supply circuit 34 includes, for example, a plurality of resistors provided in series between a node of VREG2 and a node of GND, and outputs voltages obtained by dividing the voltage of VREG2 as reference voltages VR1 to VRn.

The reference voltage supply circuit 34 supplies a reference voltage VRB for setting a bias voltage to the signal line L1. As a result, the amplitude center voltage of the oscillation signal at the signal line L1 can be set to the reference voltage VRB. The amplitude center voltage of the oscillation signal at the signal line L2 is set based on, for example, the base-emitter voltage of the bipolar transistor BP and the base current flowing through the resistor RB.

One end of the DC cut capacitor C2 is electrically coupled to the signal line L1, and the other end is electrically coupled to the supply node NS1 of the temperature compensation voltage VCP. The temperature compensation voltage VCP is supplied to the supply node NS1 via the resistor RC1. One end of the variable capacitance circuit 36 is electrically coupled to the supply node NS1, and the temperature compensation voltage VCP is supplied therethrough. The reference voltage supply circuit 34 supplies the reference voltages VR1 to VRn to supply nodes NR1 to NRn at the other end of the variable capacitance circuit 36. The capacitors C31 to C3$n$ are provided between the supply nodes NR1 to NRn of the reference voltages VR1 to VRn and the GND node. One end of the DC cut capacitor C4 is electrically coupled to the signal line L2, and the other end is electrically coupled to the supply node NS2 of the temperature compensation voltage VCP. The temperature compensation voltage VCP is supplied to the supply node NS2 via a resistor RC2. One end of the variable capacitance circuit 37 is electrically coupled to the supply node NS2, and the temperature compensation voltage VCP is supplied therethrough. Further, the reference voltage supply circuit 34 supplies the reference voltages VR1 to VRn to the supply nodes NR1 to NRn at the other end of the variable capacitance circuit 37.

The variable capacitance circuit 36 includes n number of variable capacitance elements. n is an integer of 2 or more. The n number of variable capacitance elements are, for example, MOS type variable capacitance elements, and are configured by n number of transistors. The reference voltages VR1 to VRn are supplied to the gates of the n number of transistors. Further, the source and drain of each of the n number of transistors are short-circuited, and the temperature compensation voltage VCP is supplied to the supply node NS1 to which the shorted source and drain are coupled. The capacitance of the DC cut capacitor C2 is sufficiently larger than the capacitance of the variable capacitance circuit 36. By using the variable capacitance circuit 36 having such a configuration, it is possible to ensure the linearity of the capacitance change of the total capacitance of the variable capacitance circuit 36 in a wide voltage range of the temperature compensation voltage VCP. Since the configuration of the variable capacitance circuit 37 is the same as that of the variable capacitance circuit 36, detailed description thereof is omitted.

4. Output Circuit

Figure 8:
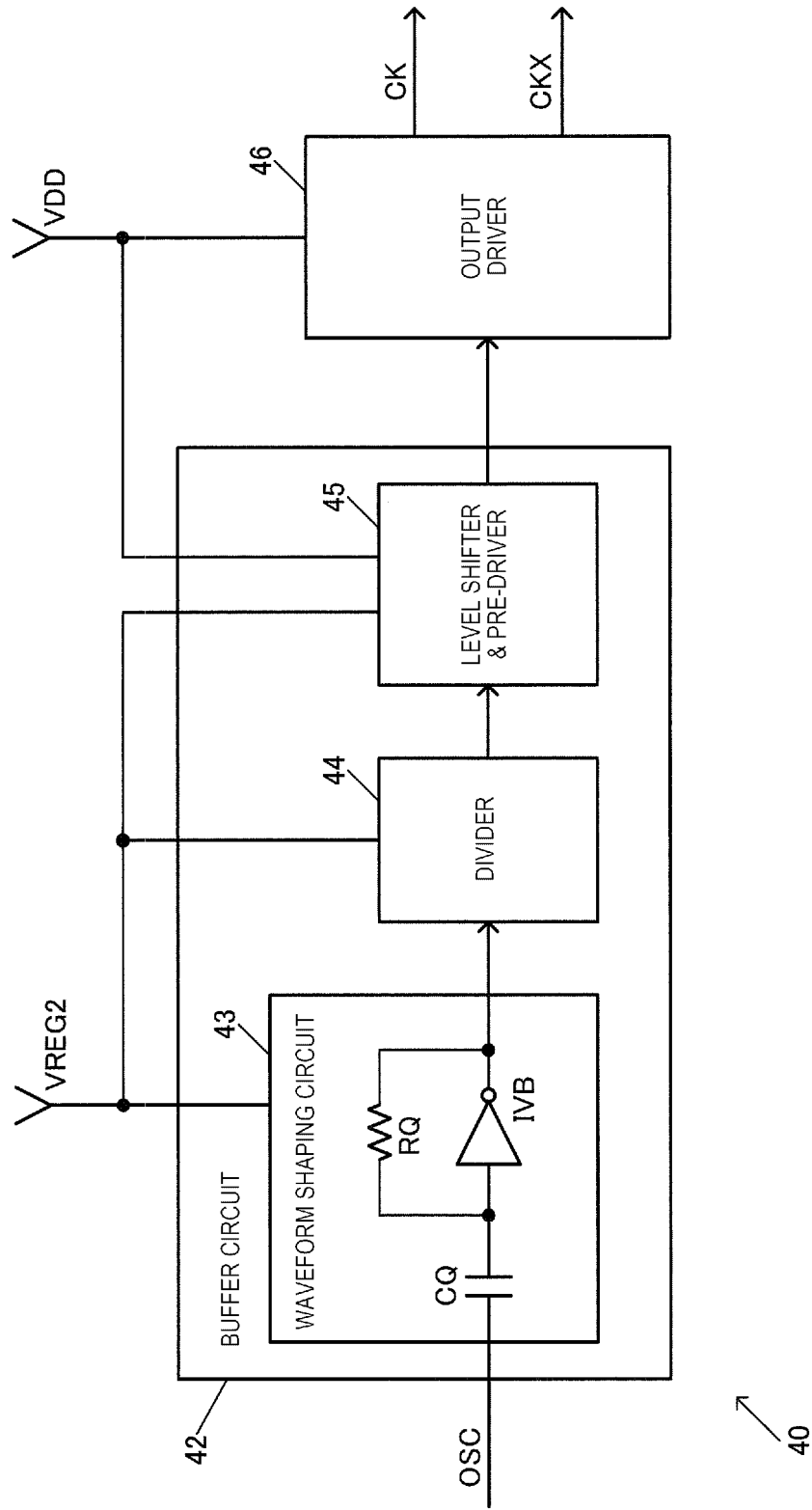
FIG. 8 is a configuration example of an output circuit.

FIG. 8 is a configuration example of the output circuit 40. The output circuit 40 includes a buffer circuit 42 that performs buffering of the oscillation signal OSC and the output driver 46 that outputs and drives the clock signals CK and CKX based on the oscillation signal OSC. The buffer circuit 42 can include, for example, a waveform shaping circuit 43, a divider 44, and a level shifter & pre-driver 45. The waveform shaping circuit 43 is a circuit that performs waveform shaping of the oscillation signal OSC and outputs a rectangular wave signal corresponding to the oscillation signal OSC, and includes an inverter IVB and a feedback resistor RQ provided between the output terminal and the input terminal of the inverter IVB. The divider 44 is a circuit that divides the clock. By providing the divider 44, the clock signals CK and CKX having a frequency obtained by dividing the frequency of the oscillation signal OSC can be output. The level shifter & pre-driver 45 is a circuit that performs a level shift from the power supply voltage level of VREG2 to the power supply voltage level of VDD and predrive that drives the output driver 46. For example, the regulated power supply voltage VREG2 is supplied to the waveform shaping circuit 43 and the divider 44 of the buffer circuit 42, and the regulated power supply voltage VREG2 and the power supply voltage VDD are supplied to the level shifter & pre-driver 45. On the other hand, the power supply voltage VDD is supplied to the output driver 46.

The output driver 46 may include at least one driver circuit selected from an LVDS driver circuit, a PECL driver circuit, an HCSL driver circuit, and a differential CMOS driver circuit. When these plurality of driver circuits are provided in the output driver 46, some of the transistors constituting the plurality of driver circuits may be shared among the plurality of driver circuits.

Figure 9:
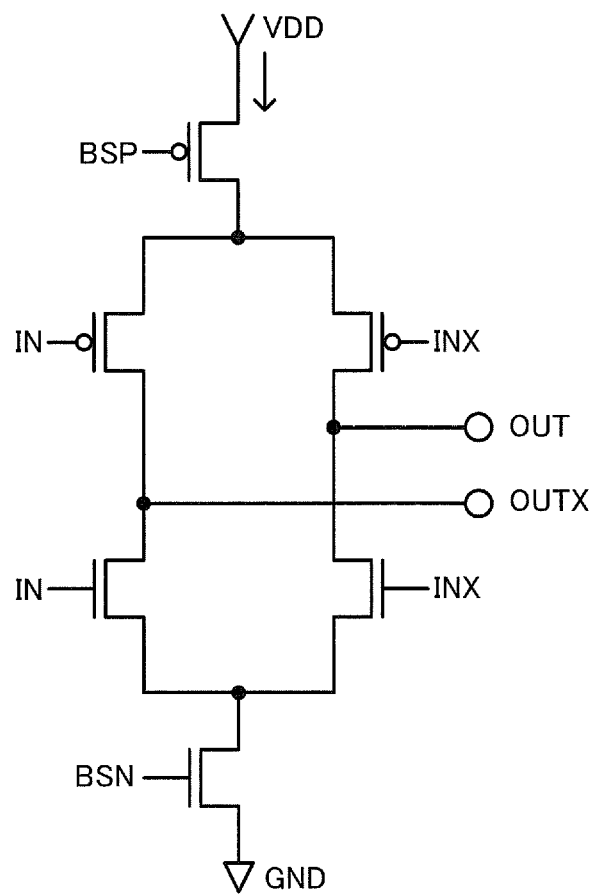
FIG. 9 is an explanatory diagram of an LVDS driver circuit.
Figure 13:
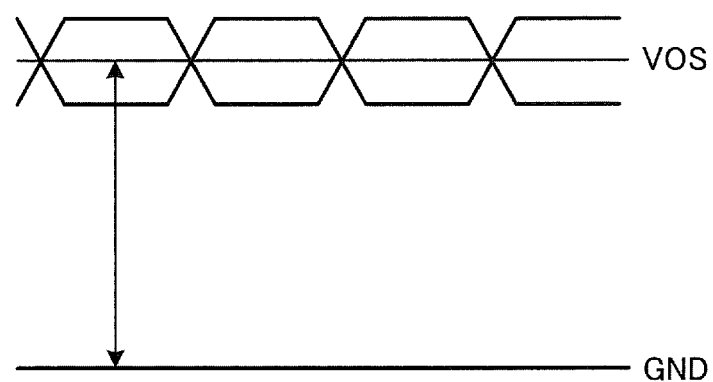
FIG. 13 is a signal waveform example of a differential output signal of LVDS.

FIG. 9 is a configuration example of an LVDS driver circuit. This driver circuit includes, for example, a P-type transistor for a current source that supplies a drive current of 3.5 mA, P-type and N-type transistors constituting a differential portion that receives differential input signals IN and INX and outputs differential output signals OUT and OUTX, and an N-type transistor provided on the GND side. The output signals OUT and OUTX correspond to the clock signals CK and CKX. FIG. 13 is a signal waveform example of a differential output signal of LVDS. The differential output signal of LVDS is a signal having an amplitude of, for example, 0.35 V with the voltage VOS with respect to GND as the center voltage.

Figure 10:
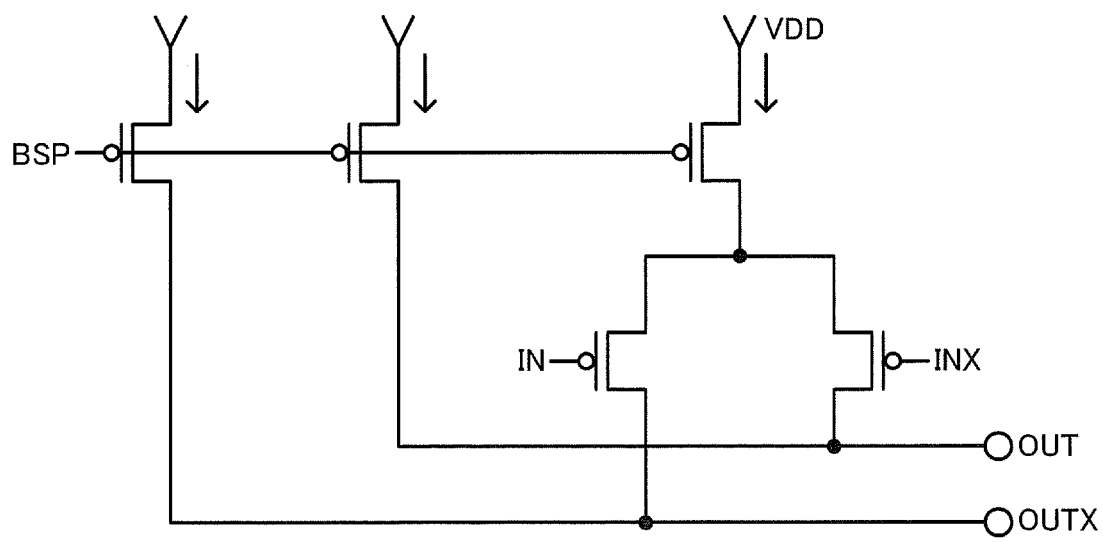
FIG. 10 is an explanatory diagram of a PECL driver circuit.
Figure 14:
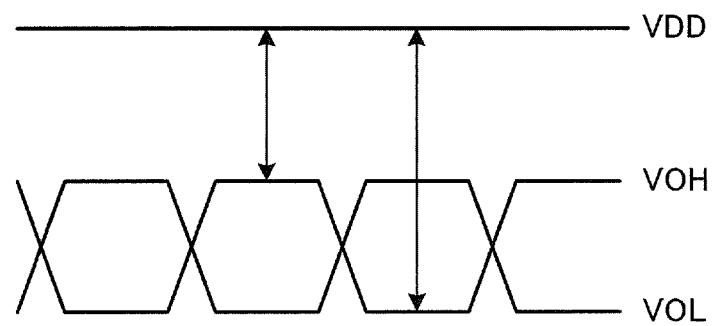
FIG. 14 is a signal waveform example of a differential output signal of PECL.

FIG. 10 is a configuration example of a PECL driver circuit. In this driver circuit, for example, includes a P-type transistor for supplying a driving current of 15.25 mA, two P-type transistors constituting a differential portion, and two P-type transistors that constitute a bias current circuit for supplying a bias current of 5.7 mA to the nodes of the output signals OUT and OUTX. This driver circuit is actually called low voltage positive emitter coupled logic (LV-PECL), but is simply described as PECL in the present embodiment. FIG. 14 is a signal waveform example of a differential output signal of PECL. The differential output signal of PECL is a signal having an amplitude such that the voltage on the high potential side becomes VOH and the voltage on the low potential side becomes VOL. VOH is a voltage that becomes, for example, 0.9525 V on the negative potential side with respect to VDD, and VOL is a voltage that becomes, for example, 1.715 V, on the negative potential side with respect to VDD. In PECL, Thevenin termination or Y termination is performed on the receiving side.

Figure 11:
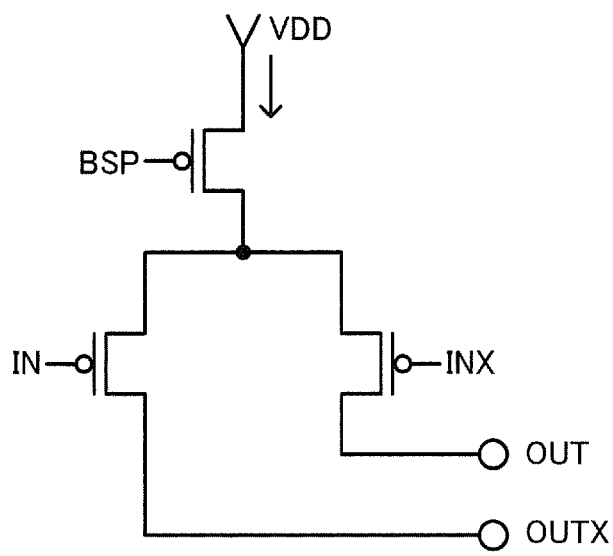
FIG. 11 is an explanatory diagram of an HCSL driver circuit.
Figure 12:
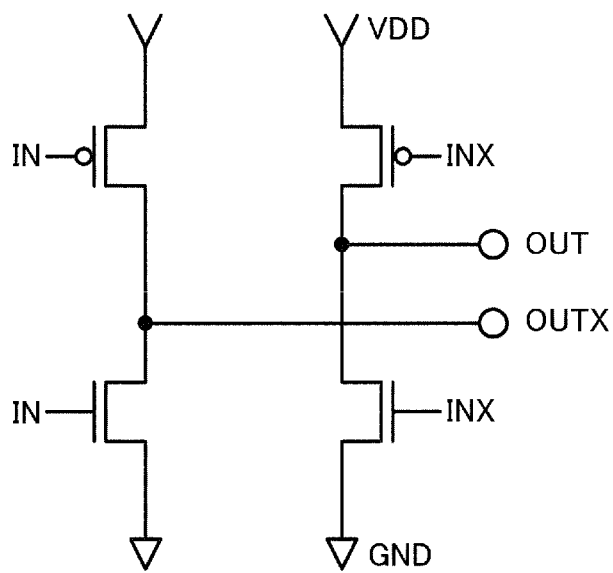
FIG. 12 is an explanatory diagram of a CMOS driver circuit.

FIG. 11 is a configuration example of an HCSL driver circuit. This driver circuit has, for example, a P-type transistor for supplying a driving current of 15 mA and two P-type transistors constituting a differential portion. The differential output signal of HCSL is, for example, a signal having an amplitude of 1.15 V or less with 0.4 V as the center voltage. FIG. 12 is a configuration example of a differential CMOS driver circuit. This driver circuit includes a P-type transistor and an N-type transistor which are provided in series between VDD and GND and have an input signal IN input to the gate, and a P-type transistor and an N-type transistor which are provided in series between VDD and GND and have an input signal INX input to the gate. The differential output signal of this CMOS driver circuit is a full swing signal in the voltage range from VDD to GND.

Figure 15:
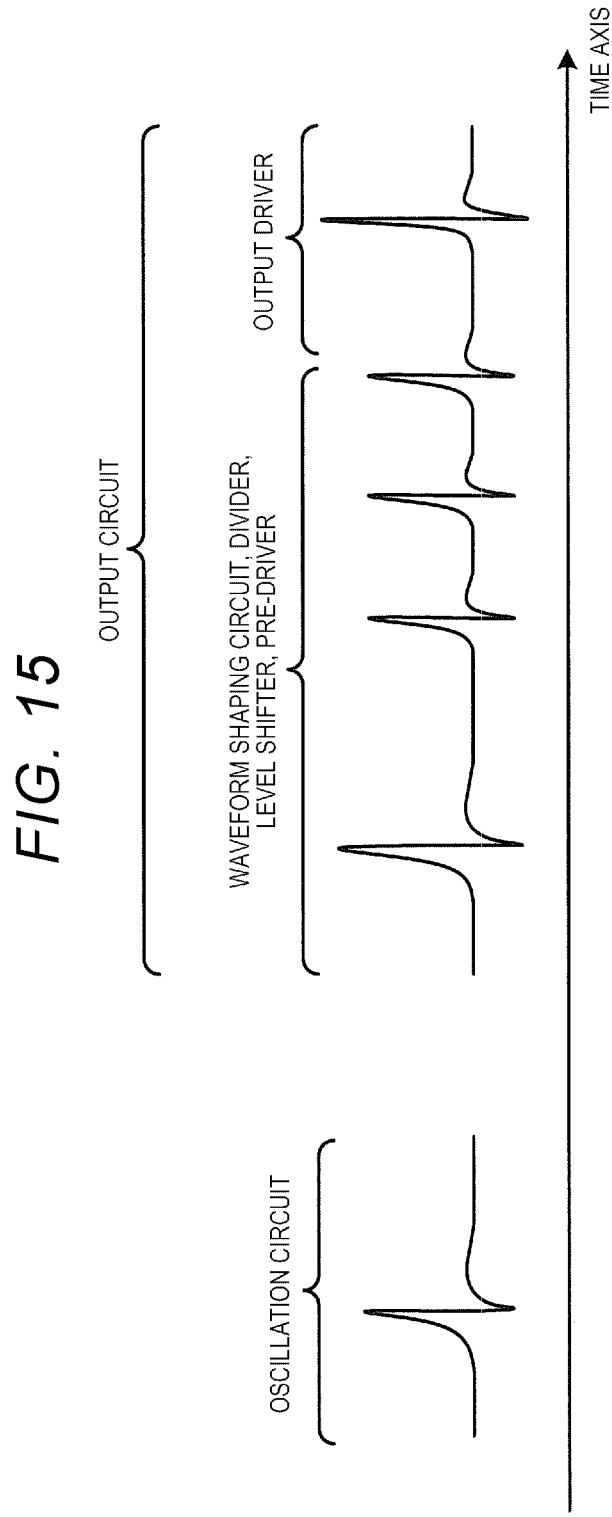
FIG. 15 is an explanatory diagram of noise generated in the oscillation circuit and the output circuit.

FIG. 15 is a diagram schematically showing noise generated in the oscillation circuit 30 and the output circuit 40. For example, in a source oscillator 4 that does not have a PLL circuit or the like, the frequency of the noise component of the oscillation circuit 30 and the frequency of the noise component of the output circuit 40 are the same frequency. That is, noise appears at the same frequency in the noise spectrum. However, as shown in FIG. 15, noise generated in each circuit of the output circuit 40 is generated at different timings, and there are more noise generating elements than the oscillation circuit 30. Therefore, even if the frequency of the noise component is the same, the spurious intensity becomes strong, and the output circuit 40 becomes a noise source that generates a lot of noise.

In this respect, in the present embodiment, the output circuit 40 is disposed along the side SD2, and the distance between the ground pad T4 disposed on the side SD4 that is the opposite side of the side SD2 and the output circuit 40 is increased. As a result, for example, adverse effects on the ground voltage due to noise such as power supply noise generated in the output circuit 40 can be reduced. For example, the reference voltage supply circuit 34 generates the reference voltage VREF based on the ground voltage, but noise generated in the output circuit 40 is suppressed from overlapping the ground voltage. Thereby, the fluctuation of the reference voltage VREF can also be suppressed, for example, deterioration of the temperature compensation accuracy of the temperature compensation circuit 60 is suppressed, and the phase noise of the clock signal can be reduced.

In the present embodiment, the regulator 81 that supplies the regulated power supply voltage VREG1 to the temperature compensation circuit 60 and the like, and the regulator 82 that supplies the regulated power supply voltage VREG2 to the output circuit 40 and the like are provided separately. As described with reference to FIG. 4, the wiring width WP1 of the power supply line LPW1 that supplies the power supply voltage VDD to the regulator 81 is narrowed to increase the impedance. As a result, the power supply noise generated on the regulator 82 side is suppressed from reaching the regulator 81 side, so that the temperature compensation of the temperature compensation circuit 60 can be highly accurate and the phase noise can be reduced.

5. Regulator

Figure 16:
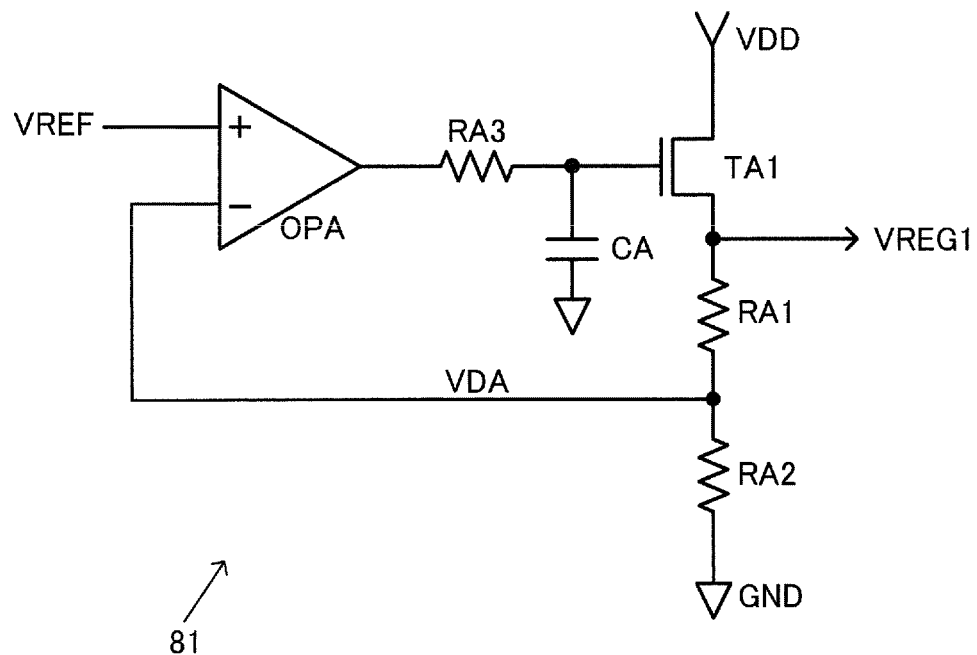
FIG. 16 is a configuration example of a regulator.
Figure 17:
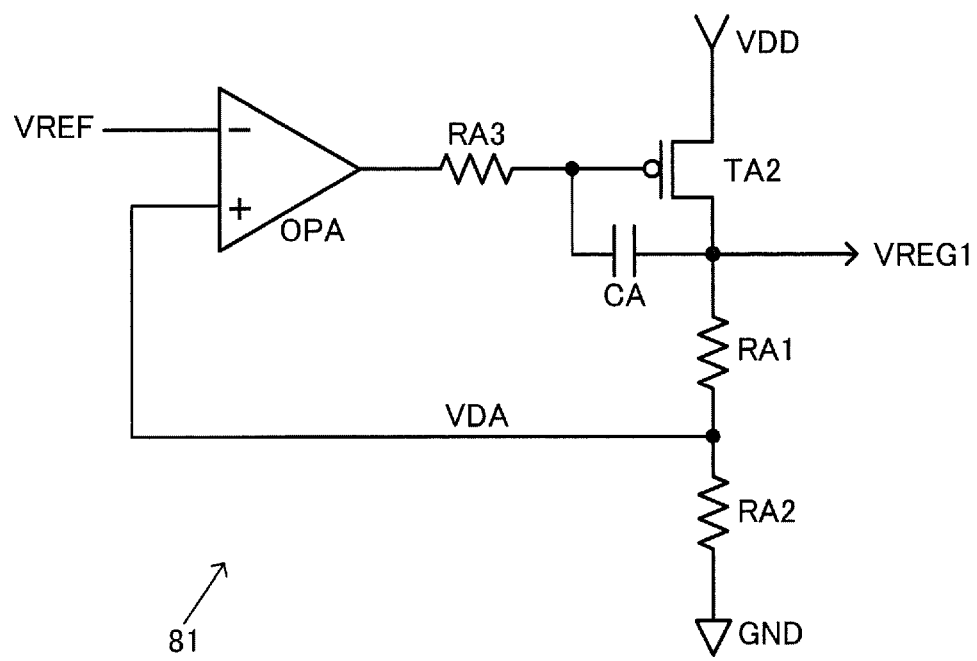
FIG. 17 is another configuration example of the regulator.

FIG. 16 is a configuration example of the regulator 81. The regulator 81 includes a driving N-type transistor TA1 and resistors RA1 and RA2 provided in series between the VDD node and the GND node, and an operational amplifier OPA. Further, the regulator 81 can include a resistor RA3 and a capacitor CA provided at the output terminal side of the operational amplifier OPA. The reference voltage VREF is input to the non-inverting input terminal of the operational amplifier OPA, and the voltage VDA obtained by dividing the regulated power supply voltage VREG1 by the resistors RA1 and RA2 is input to the inverting input terminal. The output terminal of the operational amplifier OPA is coupled to the gate of the transistor TA1 via the resistor RA3, and the regulated power supply voltage VREG1 is output from the drain node of the transistor TA1. In FIG. 17, unlike FIG. 16, the driving transistor is a P-type transistor TA2, the reference voltage VREF is input to the inverting input terminal of the operational amplifier OPA, and the voltage VDA is input to the non-inverting input terminal. In FIG. 17, the coupling configuration of the phase compensation capacitor CA is also different from that in FIG. 16.

The circuit configuration of the regulator 82 is the same as that of the regulator 81 of FIG. 17. However, in the regulator 82, at least one of the resistors RA1 and RA2 in FIGS. 16 and 17 is a variable resistor. Then, the regulated power supply voltage VREG2 is output from the drain nodes of the transistors TA1 and TA2. For example, in the regulator 82, the resistance value of at least one of the resistor RA1 and the resistor RA2 is variably set based on voltage setting information stored in the storage portion 100 realized by a nonvolatile memory. As a result, the regulated power supply voltage VREG2 which is a variable voltage is output.

That is, in the regulator 81, the resistors RA1 and RA2 become resistors which is a fixed resistance value, for example, so that the regulated power supply voltage VREG1 which is a fixed voltage is output. On the other hand, the regulator 82 can output a variable regulated power supply voltage VREG2 because at least one of the resistors RA1 and RA2 is a variable resistor. Also in the regulator 81, the resistance values of the resistors RA1 and RA2 may be variably set. For example, the resistance value can be adjusted to compensate for fluctuations in the regulated power supply voltage VREG1 with respect to process fluctuations during manufacture and shipment. In this case, the regulator 82 has a wider adjustment range of the resistance value than the regulator 81, and the adjustment range of the regulated power supply voltage is also wider.

Figure 18:
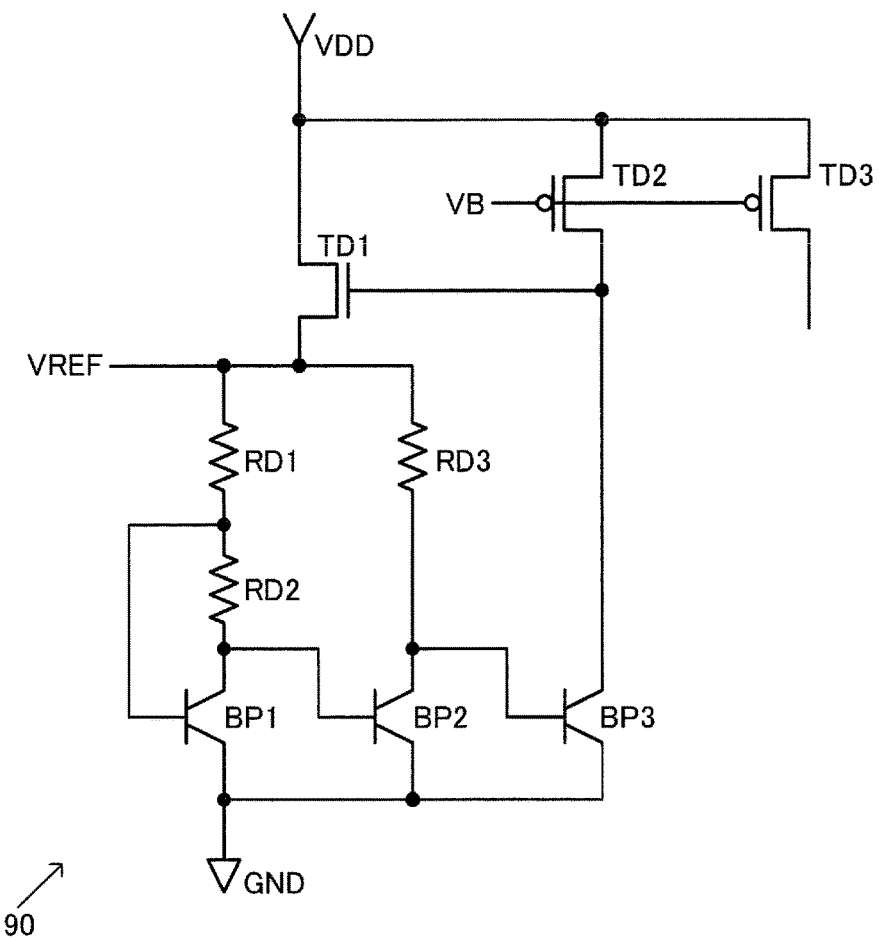
FIG. 18 is a configuration example of a reference voltage generation circuit.

6. Reference Voltage Generation Circuit, Temperature Sensor, and Temperature Compensation Circuit FIG. 18 is a configuration example of the reference voltage generation circuit 90. The reference voltage generation circuit 90 includes an N-type transistor TD1, resistors RD1, RD2, and RD3, and bipolar transistors BP1 and BP2 provided between the VDD node and the GND node. The reference voltage generation circuit 90 includes P-type transistors TD2 and TD3 to which the bias voltage VB is input to the gate, and a bipolar transistor BP3 provided between the drain node of the transistor TD2 and the GND node. The reference voltage generation circuit 90 is a band gap reference circuit, and generates and outputs a reference voltage VREF based on the band gap voltage. For example, the base-emitter voltages of PNP-type bipolar transistors BP1 and BP2 are VBE1 and VBE2, and ΔVBE=VBE1−VBE2. The reference voltage generation circuit 90 outputs a reference voltage VREF that satisfies, for example, VREF=K×ΔVBE+VBE2. K is set by the resistance values of the resistors RD1 and RD2. For example, since VBE2 has a negative temperature characteristic and ΔVBE has a positive temperature characteristic, a constant voltage reference voltage VREF having no temperature dependency can be generated by adjusting the resistance values of the resistors RD1 and RD2. The generated reference voltage VREF is a constant voltage based on the ground voltage. The reference voltage generation circuit 90 is not limited to the configuration shown in FIG. 18, and various configurations such as a circuit that generates the reference voltage VREF using a work function difference voltage of a transistor can be used.

Figure 19:
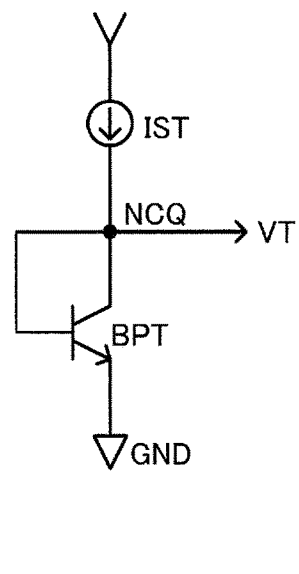
FIG. 19 is a configuration example of a temperature sensor.

FIG. 19 is a configuration example of the temperature sensor 70. The temperature sensor 70 includes a current source IST and a bipolar transistor BPT provided in series between a power supply node and a GND node. The collector node and the base node of the bipolar transistor BPT are coupled to each other and are diode-coupling. As a result, the temperature detection voltage VT having temperature dependency is output from the output node NCQ of the temperature sensor 70. For example, the temperature detection voltage VT having a negative temperature characteristic generated due to the temperature dependency of the base-emitter voltage is output. The configuration of the temperature sensor 70 is not limited to the configuration of FIG. 19, and various modifications can be made. For example, a resistor is provided between the output node NCQ of the temperature sensor 70 and the collector node of the bipolar transistor BPT, and a variable resistor is provided between the emitter node of the bipolar transistor BPT and the GND node. With such a configuration, it becomes possible to realize the 0th order correction of the temperature compensation using the temperature sensor 70.

Figure 20:
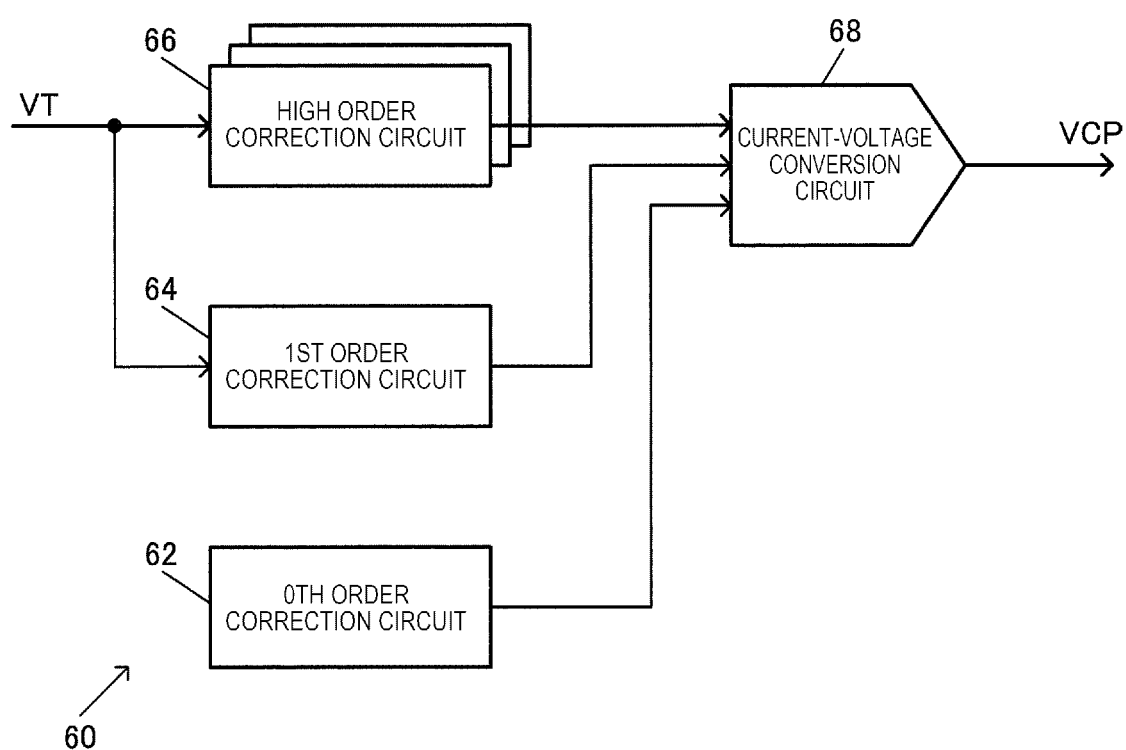
FIG. 20 is a configuration example of a temperature compensation circuit.

FIG. 20 is a configuration example of the temperature compensation circuit 60. The temperature compensation circuit 60 includes a 0th order correction circuit 62, a 1st order correction circuit 64, a high order correction circuit 66, and a current-voltage conversion circuit 68. For example, when performing 3rd order correction, 4th order correction, and 5th order correction, a plurality of correction circuits such as a 3rd order correction circuit, a 4th order correction circuit, and a 5th order correction circuit are provided as the high order correction circuit 66. The high order correction circuit 66 is also called a function generation circuit, and generates a function current corresponding to a polynomial that approximates the characteristics of the temperature compensation voltage VCP. For example, a polynomial is a function with temperature as a variable.

The temperature compensation circuit 60 performs analog temperature compensation based on polynomial approximation. Specifically, the temperature compensation circuit 60 generates and outputs the temperature compensation voltage VCP by approximating a polynomial that is a function having temperature as a variable. Therefore, the storage portion 100 of FIG. 2 stores the 0th order coefficient, the 1st order coefficient, and the high order coefficient of a polynomial that approximates the characteristics of the temperature compensation voltage VCP as 0th order correction data, 1st order correction data, and high order correction data. Then, the 0th order correction circuit 62, the 1st order correction circuit 64, and the high order correction circuit 66 output a 0th order correction current signal, a 1st order correction current signal, and a high order correction current signal based on the 0th order correction data, the 1st order correction data, and the high order correction data stored in the storage portion 100. The 0th order correction current signal, the 1st order correction current signal, and the high order correction current signal can be referred to as a 0th order component signal, a 1st order component signal, and a high order component signal of the function current. The 1st order correction circuit 64 and the high order correction circuit 66 generate and output a 1st order correction current signal and a high order correction current signal based on the temperature detection voltage VT that changes linearly with respect to temperature. The current-voltage conversion circuit 68 performs addition process of the 0th order correction current signal, the 1st order correction current signal, and the high order correction current signal, performs current-voltage conversion, and outputs the temperature compensation voltage VCP. This realizes analog temperature compensation based on polynomial approximation.

As described above, when the temperature sensor 70 is used to perform the 0th order correction of the temperature compensation, the configuration of the 0th order correction circuit 62 can be omitted. In this case, in order to correct the deviation of the temperature detection voltage characteristic caused by the fluctuation of the offset voltage of the temperature detection voltage VT, for example, a 2nd order correction circuit or a 4th order correction circuit may be provided in the temperature compensation circuit 60 that performs temperature compensation of 5th order polynomial approximation.

7. Oscillator

Figure 21:
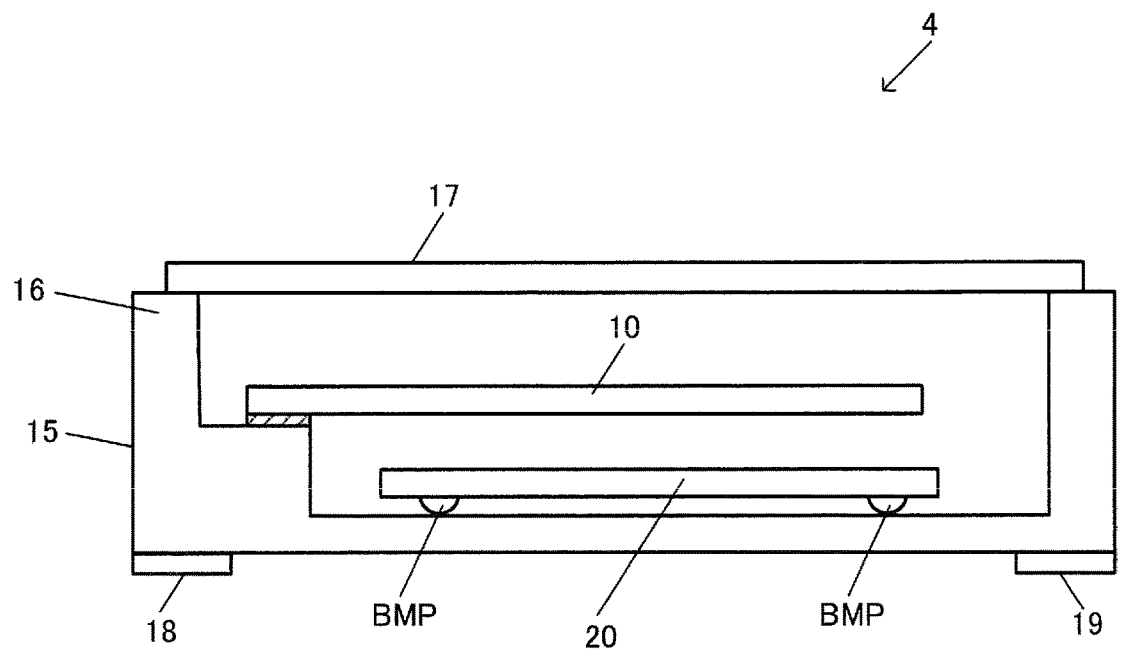
FIG. 21 is a first structural example of an oscillator.

Next, a structural example of the oscillator 4 of the present embodiment will be described. FIG. 21 is a first structural example of the oscillator 4. The oscillator 4 includes the resonator 10, the integrated circuit device 20, and a package 15 that houses the resonator 10 and the integrated circuit device 20. The package 15 is formed of, for example, ceramic or the like, and has a housing space inside thereof, and the resonator 10 and the integrated circuit device 20 are stored in the housing space. The housing space is hermetically sealed and is preferably in a reduced pressure state that is close to a vacuum. The package 15 can suitably protect the resonator 10 and the integrated circuit device 20 from impact, dust, heat, moisture and the like.

The package 15 has a base 16 and a lid 17. Specifically, the package 15 includes the base 16 that supports the resonator 10 and the integrated circuit device 20, and the lid 17 that is bonded to the upper surface of the base 16 so as to form a housing space between the base 16 and the lid 17. Then, the resonator 10 is supported by the step-difference portion provided inside the base 16 via the terminal electrode. The integrated circuit device 20 is disposed at the inner bottom surface of the base 16. Specifically, the integrated circuit device 20 is disposed such that the active surface faces the inner bottom surface of the base 16. The active surface is a surface at which circuit elements of the integrated circuit device 20 are formed. Further, bumps BMP are formed at the pads of the integrated circuit device 20. The integrated circuit device 20 is supported at the inner bottom surface of the base 16 via the conductive bumps BMP. The conductive bump BMP is, for example, a metal bump, and the resonator 10 and the integrated circuit device 20 are electrically coupled via the bump BMP, the internal wiring of the package 15, the terminal electrode, and the like. Further, the integrated circuit device 20 is electrically coupled to external terminals 18 and 19 of the oscillator 4 via the bump BMP and the internal wiring of the package 15.

The external terminals 18 and 19 are formed at the outer bottom surface of the package 15. The external terminals 18 and 19 are coupled to an external device via external wiring. The external wiring is, for example, wiring formed at a circuit substrate at which an external device is mounted. As a result, a clock signal or the like can be output to the external device.

In FIG. 21, the integrated circuit device 20 is flip-mounted so that the active surface of the integrated circuit device 20 faces downward, but the present embodiment is not limited to such mounting. For example, the integrated circuit device 20 may be mounted so that the active surface of the integrated circuit device 20 faces upward. That is, the integrated circuit device 20 is mounted so that the active surface faces the resonator 10.

Figure 22:
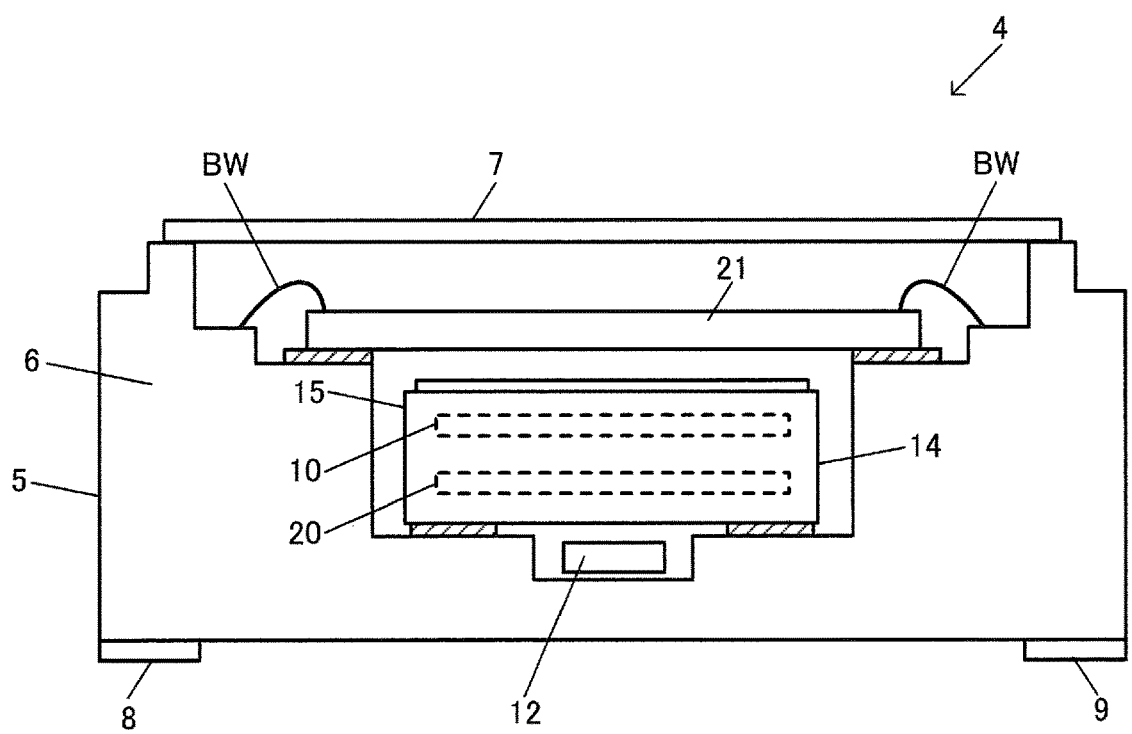
FIG. 22 is a second structural example of the oscillator.

FIG. 22 is a second structural example of the oscillator 4. The oscillator 4 in FIG. 22 includes the resonator 10, the integrated circuit device 20, and an integrated circuit device 21. Further, the oscillator 4 includes the package 15 that houses the resonator 10 and the integrated circuit device 20, and a package 5 that houses the package 15 and the integrated circuit device 21. The package 15 and the package 5 are a first package and a second package, respectively. The first package and the second package can also be referred to as a first container and a second container.

In the present embodiment, the integrated circuit device 20 housed in the package 15 performs the first temperature compensation process, and the integrated circuit device 21 housed in the package 5 performs the second temperature compensation process. For example, the resonator 10 and the integrated circuit device 20 are housed in the package 15, thereby configuring the temperature compensation type oscillator 14 that performs, for example, an analog first temperature compensation process. The oscillator 14 that performs the analog first temperature compensation process and the integrated circuit device 21 that performs the digital second temperature compensation process are housed in the package 5, thereby forming the oscillator 4 that generates a highly accurate clock signal. The integrated circuit device 21 can also be called a correction IC that performs a second temperature compensation process of fine adjustment in a digital manner.

Specifically, the package 5 is formed of, for example, ceramic or the like, and has a housing space inside thereof. In the housing space, the oscillator 14 in which the resonator 10 and the integrated circuit device 20 are housed in the package 15 and the integrated circuit device 21 are housed. The housing space is hermetically sealed and is preferably in a reduced pressure state that is close to a vacuum. The package 5 can suitably protect the integrated circuit device 21 and the oscillator 14 from impact, dust, heat, moisture, and the like.

The package 5 has a base 6 and a lid 7. Specifically, the package 5 includes the base 6 that supports the oscillator 14 and the integrated circuit device 21, and the lid 7 that is joined to the upper surface of the base 6 so as to form a housing space between the base 6 and the lid 7. The base 6 has, on the inside thereof, a first recess opening at the top surface and a second recess opening at the bottom surface of the first recess. The integrated circuit device 21 is supported at the bottom surface of the first recess. For example, the integrated circuit device 21 is supported by a step-difference portion on the bottom surface via a terminal electrode. Further, the oscillator 14 is supported at the bottom surface of the second recess. For example, the oscillator 14 is supported by a step-difference portion at the bottom surface via a terminal electrode. The base 6 has a third recess opening at the bottom surface of the second recess, and the circuit component 12 is disposed at the third recess. For example, a capacitor or a temperature sensor can be assumed as the circuit component 12 to be disposed.

The integrated circuit device 21 is electrically coupled to a terminal of the oscillator 14 via, for example, a bonding wire BW, a terminal electrode formed in a step-difference portion, or an internal wiring of the package 5. As a result, the clock signal and temperature detection signal from the oscillator 14 can be input to the integrated circuit device 21. Further, the integrated circuit device 21 is electrically coupled to external terminals 8 and 9 of the oscillator 4 via the bonding wire BW, the terminal electrode formed in the step-difference portion, and the internal wiring of the package 5. The external terminals 8 and 9 are formed at the outer bottom surface of the package 5. The external terminals 8 and 9 are coupled to an external device via external wiring. The external wiring is, for example, wiring formed at a circuit substrate at which an external device is mounted. As a result, a clock signal or the like can be output to the external device. The terminal of the oscillator 14 and the external terminals 8 and 9 may be electrically coupled.

In FIG. 22, the integrated circuit device 21 is disposed above the oscillator 14. However, the integrated circuit device 21 may be disposed below the oscillator 14. Here, the upward direction is the direction from the bottom surface of the package 5 toward the lid 7, and the downward direction is the opposite direction. Further, the integrated circuit device 21 may be provided at the side of the oscillator 14. That is, the oscillator 14 and the integrated circuit device 21 are arranged side by side in a top view of the oscillator 4.

Next, the integrated circuit device 21 will be described. The integrated circuit device 21 includes a clock signal generation circuit to which a first clock signal that is a clock signal generated by the oscillator 14 is input as a reference clock signal. Then, the clock signal generated by the clock signal generation circuit is output to the outside as the output clock signal of the oscillator 4. For example, the clock signal generation circuit of the integrated circuit device 21 is configured by a fractional-N type PLL circuit to which the first clock signal from the oscillator 14 is input as a reference clock signal. The PLL circuit compares the phase of a reference clock signal that is a first clock signal and a feedback clock signal obtained by dividing the output clock signal of the PLL circuit by a frequency dividing circuit. The fractional-N type PLL circuit is realized by setting a fractional division ratio using a delta-sigma modulator. Further, the control circuit included in the integrated circuit device 21 performs the correction process of the division ratio data set in the PLL circuit based on the temperature compensation data, thereby realizing the second temperature compensation process. The first temperature compensation process performed in the oscillator 14 is realized by a polynomial approximation temperature compensation process, for example. The clock signal generation circuit may be configured by a direct digital synthesizer. In this case, the second temperature compensation process is realized by inputting frequency control data corrected by the temperature compensation data to a direct digital synthesizer that operates using the first clock signal as a reference clock signal.

According to the oscillator 4 of FIG. 22, when the integrated circuit device 20 that causes the resonator 10 to oscillate performs the first temperature compensation process, the frequency fluctuation amount in the frequency-temperature characteristics of the first clock signal output from the integrated circuit device 20 that is the first integrated circuit device can be reduced. The integrated circuit device 21 that is the second integrated circuit device performs the second temperature compensation process when generating the clock signal based on the first clock signal from the integrated circuit device 20. After the first temperature compensation process is performed by the integrated circuit device 20 as described above, by performing the second temperature compensation process by the integrated circuit device 21, it becomes possible to reduce the micro jump of the frequency caused by the fluctuation of the temperature measurement result, and the like, and to achieve high accuracy of the clock frequency of the oscillator 4. Further, in the oscillator 4 of FIG. 22, the first temperature compensation process may be performed using a temperature sensor provided in the integrated circuit device 20, and a temperature detection signal of the temperature sensor may be output from the integrated circuit device 20 and input to the integrated circuit device 21. Then, the integrated circuit device 21 may perform the second temperature compensation process based on the input temperature detection signal. In this way, since the first temperature compensation process in the integrated circuit device 20 and the second temperature compensation process in the integrated circuit device 21 can be performed based on the temperature detection signal from the same temperature sensor, a more appropriate temperature compensation process can be realized. In this case, the distance between the temperature sensor incorporated in the integrated circuit device 20 and the resonator 10 is shorter than the distance between the temperature sensor and the integrated circuit device 21. Therefore, by performing the temperature compensation process of the digital method, the distance between the integrated circuit device 21 that generates a large amount of heat and the resonator 10 can be increased, and the adverse effect of the heat generation of the integrated circuit device 21 on the temperature detection result of the temperature sensor can be reduced. Therefore, the temperature of the resonator 10 can be measured more accurately using the temperature sensor incorporated in the integrated circuit device 20.

8. Electronic Apparatus and Vehicle

Figure 23:
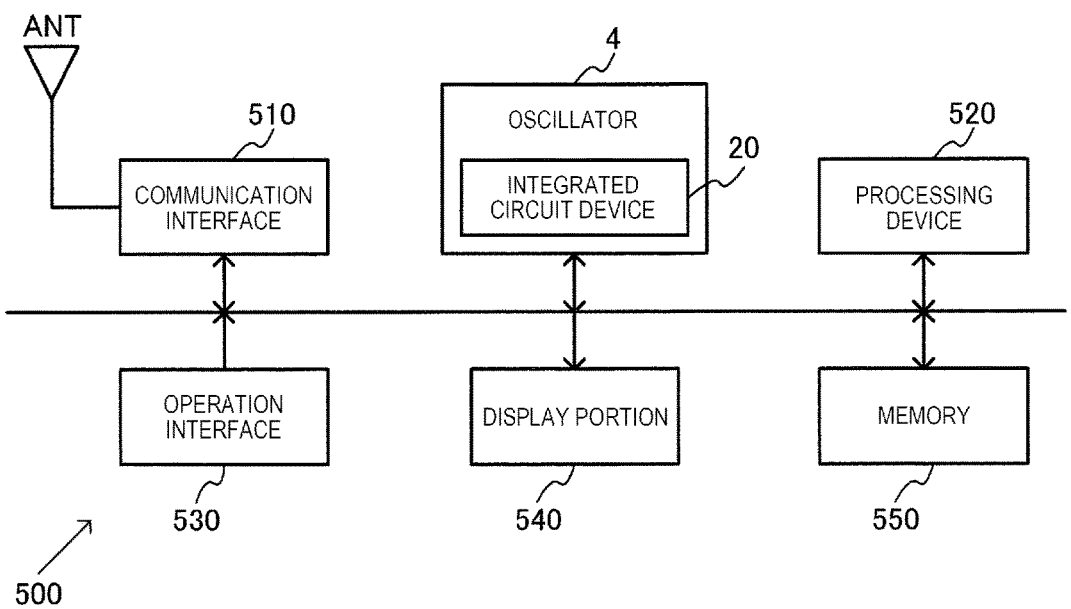
FIG. 23 is a configuration example of an electronic apparatus.

FIG. 23 shows a configuration example of an electronic apparatus 500 including the integrated circuit device 20 of the present embodiment. The electronic apparatus 500 includes the integrated circuit device 20 of the present embodiment and a processing device 520 that operates based on a clock signal based on the oscillation signal of the oscillation circuit 30 of the integrated circuit device 20. Specifically, the electronic apparatus 500 includes the oscillator 4 having the integrated circuit device 20 of the present embodiment, and the processing device 520 operates based on a clock signal from the oscillator 4. Further, the electronic apparatus 500 can include an antenna ANT, a communication interface 510, an operation interface 530, a display portion 540, and a memory 550. The electronic apparatus 500 is not limited to the configuration in FIG. 23, and various modifications such as omitting some of these components or adding other components are possible.

The electronic apparatus 500 is, for example, a network-related device such as a base station or a router, a high precision measuring device that measures physical quantities such as distance, time, flow velocity, or flow rate, a biological information measuring device that measures biological information, or an in-vehicle device. The biological information measuring device is, for example, an ultrasonic measurement device, a pulse wave meter, a blood pressure measurement device, or the like. The in-vehicle device is a device for automatic driving. The electronic apparatus 500 may be a wearable device such as a head-mounted display device or a clock-related device, a robot, a printing device, a projection device, a mobile information terminal such as a smartphone, a content providing device that distributes content, or a video device such as a digital camera or a video camera.

Moreover, as the electronic apparatus 500, there is a device used for a next-generation mobile communication system such as 5G. For example, the integrated circuit device 20 of the present embodiment can be used in various devices such as a base station, a remote radio head (RRH), or a mobile communication terminal of a next-generation mobile communication system. In the next-generation mobile communication system, a high-accuracy clock frequency is required for time synchronization and the like, which is suitable as an application example of the integrated circuit device 20 of the present embodiment that can generate a high-accuracy clock signal.

The communication interface 510 performs a process of receiving data from the outside via the antenna ANT and transmitting data to the outside. The processing device 520 that is a processor performs a control process of the electronic apparatus 500, various digital processes of data transmitted and received via the communication interface 510, and the like. The function of the processing device 520 can be realized by a processor such as a microcomputer. The operation interface 530 is for a user to perform an input operation, and can be realized by an operation button, a touch panel display, or the like. The display portion 540 displays various types of information and can be realized by a display such as a liquid crystal or an organic EL. The memory 550 stores data, and the function can be realized by a semiconductor memory such as a RAM or a ROM.

Figure 24:
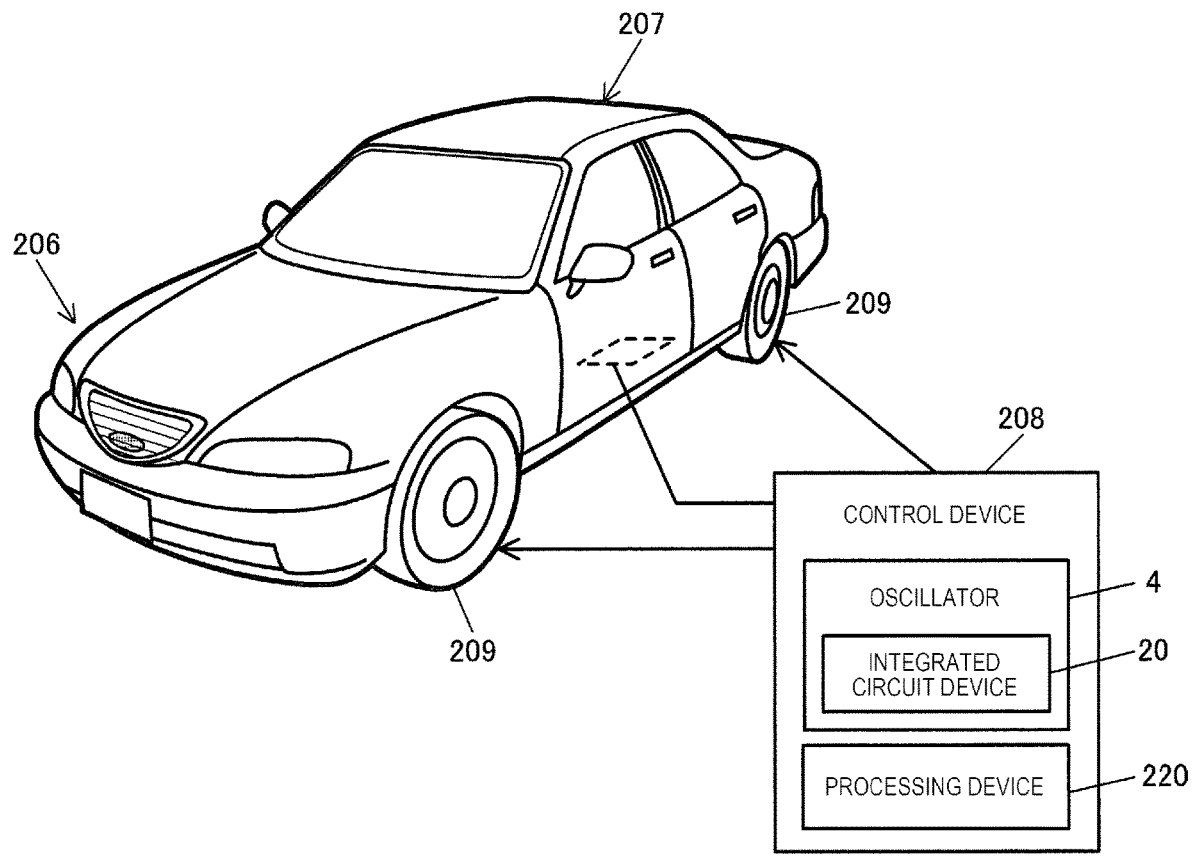
FIG. 24 is a configuration example of a vehicle.

FIG. 24 shows an example of a vehicle including the integrated circuit device 20 of the present embodiment. The vehicle includes the integrated circuit device 20 of the present embodiment and a processing device 220 that operates by a clock signal based on the oscillation signal of the oscillation circuit 30 of the integrated circuit device 20. Specifically, the vehicle includes the oscillator 4 having the integrated circuit device 20 of the present embodiment, and the processing device 220 operates based on a clock signal from the oscillator 4. The integrated circuit device 20 of the present embodiment can be incorporated into various vehicles such as a car, an airplane, a motorcycle, a bicycle, or a ship. The vehicle is a device or an apparatus that includes a driving mechanism such as an engine or a motor, a steering mechanism such as a steering wheel or a rudder, and various electronic apparatuses, and moves on the ground, the sky, or the sea. FIG. 24 schematically shows an automobile 206 as a specific example of the vehicle. The integrated circuit device 20 of the present embodiment is incorporated in the automobile 206. Specifically, the automobile 206 which is a vehicle includes a control device 208, and the control device 208 includes the oscillator 4 including the integrated circuit device 20 of the present embodiment and the processing device 220 that operates based on a clock signal generated by the oscillator 4. The control device 208 controls the hardness of the suspension, for example, according to the posture of a vehicle body 207, and controls the brakes of individual wheels 209. For example, automatic driving of the automobile 206 may be realized by the control device 208. The device in which the integrated circuit device 20 of the present embodiment is incorporated is not limited to such a control device 208, and can be incorporated in various in-vehicle devices such as a meter panel device and a navigation device provided in a vehicle such as the automobile 206.

As described above, an integrated circuit device of the present embodiment includes a first pad electrically coupled to one end of a resonator, a second pad electrically coupled to the other end of the resonator, an oscillation circuit that is electrically coupled to the first pad and the second pad and generates an oscillation signal by causing the resonator to oscillate, and an output circuit that outputs a clock signal based on the oscillation signal. The oscillation circuit is disposed along a first side of the integrated circuit device among the first side, a second side that intersects the first side, a third side that is an opposite side of the first side, and a fourth side that is an opposite side of the second side. The first pad and the second pad are disposed in the oscillation circuit along the first side in a plan view, and the output circuit is disposed along the second side.

According to the present embodiment, the integrated circuit device includes the first pad and the second pad electrically coupled to the resonator, the oscillation circuit that generates the oscillation signal, and the output circuit that outputs the clock signal based on the oscillation signal. The oscillation circuit is disposed along the first side of the integrated circuit device, the first pad and the second pad are disposed in the oscillation circuit along the first side, and the output circuit is disposed along the second side. As described above, the oscillation circuit is disposed along the first side and the output circuit is disposed along the second side intersecting the first side, so that adverse effects due to noise such as radiation noise can be reduced. Further, by disposing the first pad and the second pad in the oscillation circuit along the first side, for example, deterioration of oscillation characteristics due to parasitic resistance and parasitic capacitance of the first signal line and the second signal line coupled to the first pad and the second pad can be suppressed, and a highly accurate clock signal can be generated. Therefore, it is possible to provide an integrated circuit device that can generate a highly accurate clock signal based on an oscillation signal while reducing noise such as radiation noise.

In the present embodiment, the output circuit may be disposed at a corner portion in which the second side and the third side intersect each other.

In this way, the output circuit can be disposed close to the corner portion of the integrated circuit device, so that a compact and efficient layout arrangement is possible.

In the present embodiment, a temperature compensation circuit that performs temperature compensation of an oscillation frequency of the oscillation circuit based on a temperature detection voltage from a temperature sensor may further be included, in which, when a direction from the first side toward the third side is a first direction, and a direction from the second side toward the fourth side is a second direction, the temperature compensation circuit may be disposed in the first direction of the oscillation circuit and in the second direction of the output circuit.

In this way, the temperature compensation circuit can be disposed effectively using the area in the first direction of the oscillation circuit and in the second direction of the output circuit.

In the present embodiment, a control circuit that controls the temperature compensation circuit may further be included, in which the control circuit may be disposed in the second direction of the temperature compensation circuit.

In this way, the control circuit for controlling the temperature compensation circuit can be disposed close to the second direction of the temperature compensation circuit, and it becomes possible to input a control signal from the control circuit to the temperature compensation circuit through a short path.

In the present embodiment, a regulator that supplies a regulated power supply voltage to the temperature compensation circuit may further be included, in which the regulator may be disposed in the first direction of the temperature compensation circuit.

In this way, the regulated power supply voltage generated by the regulator can be input to the temperature compensation circuit through a short path, and the parasitic resistance, and parasitic capacitance of the power supply line for supplying the regulated power supply voltage can be reduced.

In the present embodiment, a reference voltage generation circuit that supplies a reference voltage to the regulator, and a ground pad to which a ground voltage is supplied may further be included, in which the reference voltage generation circuit may be disposed between the ground pad and the regulator.

In this way, the ground voltage from the ground pad can be supplied to the reference voltage generation circuit through a short path, and the reference voltage generation circuit can generate the reference voltage based on the ground voltage having a stable potential.

In the present embodiment, a temperature sensor, and a temperature compensation circuit that performs temperature compensation of an oscillation frequency of the oscillation circuit based on a temperature detection voltage from the temperature sensor may further be included, in which, when a direction from the first side toward the third side is a first direction, and a direction from the second side toward the fourth side is a second direction, the temperature sensor may be disposed in the second direction of the oscillation circuit.

In this way, the distance between the first pad or the second pad disposed in the oscillation circuit and the temperature sensor can be reduced, and the temperature of the resonator can be detected more appropriately using the temperature sensor.

In the present embodiment, the temperature sensor may be disposed at a corner portion in which the first side and the fourth side intersect each other.

In this way, the temperature sensor can be disposed at a position away from the output circuit disposed along the second side, it is possible to suppress the heat from the output circuit from adversely affecting the temperature detection result of the temperature sensor.

In the present embodiment, a clock pad that outputs the clock signal may be included, in which the clock pad may be disposed in the output circuit.

In this way, since the clock pad can be disposed effectively using the circuit arrangement area of the output circuit, an efficient layout arrangement is possible.

In the present embodiment, a power supply pad to which a power supply voltage is supplied, and a ground pad to which a ground voltage is supplied may further be included, in which the power supply pad may be disposed along the second side, and the ground pad may be disposed along the fourth side.

In this way, the power supply pad can be disposed near the output circuit, and the adverse effect of power supply noise generated by the output circuit can be reduced. Further, the ground pad is disposed at a position far from the output circuit, and adverse effects due to fluctuations in the ground voltage can be reduced.

In the present embodiment, the oscillation circuit may be disposed in a direction along the first side as a longitudinal direction.

In this way, the oscillation circuit can be disposed in an area having a predetermined width from the first side, and an efficient layout arrangement is possible.

In the present embodiment, the output circuit may be disposed in a direction along the second side as a longitudinal direction.

In this way, the output circuit can be disposed in an area having a predetermined width from the second side, and an efficient layout arrangement is possible.

The present embodiment relates to the integrated circuit device described above and an oscillator including a resonator.

The present embodiment relates to an electronic apparatus including the integrated circuit device described above and a processing device that operates according to a clock signal.

The present embodiment relates to a vehicle including the integrated circuit device described above and a processing device that operates according to a clock signal.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term anywhere in the specification or the drawings. All combinations of the present embodiment and the modified examples are also included in the scope of the present disclosure. Further, the configuration and operation of the integrated circuit device, the oscillator, the electronic apparatus, and the vehicle are not limited to those described in the present embodiment, and various modifications can be made.

What is claimed is:

1. An integrated circuit device comprising:
   a first pad electrically coupled to one end of a resonator;
   a second pad electrically coupled to the other end of the resonator;
   an oscillation circuit that is electrically coupled to the first pad and the second pad and generates an oscillation signal by causing the resonator to oscillate; and
   an output circuit that outputs a clock signal based on the oscillation signal, wherein
   the oscillation circuit is disposed along a first side of the integrated circuit device among the first side, a second side that intersects the first side, a third side that is an opposite side of the first side, and a fourth side that is an opposite side of the second side,
   the first pad and the second pad are disposed in the oscillation circuit along the first side in a plan view, and
   the output circuit is disposed along the second side.

2. The integrated circuit device according to claim 1, wherein
   the output circuit is disposed at a corner portion in which the second side and the third side intersect each other.

3. The integrated circuit device according to claim 1, further comprising:
   a temperature compensation circuit that performs temperature compensation of an oscillation frequency of the oscillation circuit based on a temperature detection voltage from a temperature sensor, wherein
   when a direction from the first side toward the third side is a first direction, and a direction from the second side toward the fourth side is a second direction, the temperature compensation circuit is disposed in the first direction of the oscillation circuit and in the second direction of the output circuit.

4. The integrated circuit device according to claim 3, further comprising:
   a control circuit that controls the temperature compensation circuit, wherein
   the control circuit is disposed in the second direction of the temperature compensation circuit.

5. The integrated circuit device according to claim 3, further comprising:
   a regulator that supplies a regulated power supply voltage to the temperature compensation circuit, wherein
   the regulator is disposed in the first direction of the temperature compensation circuit.

6. The integrated circuit device according to claim 5, further comprising:
   a reference voltage generation circuit that supplies a reference voltage to the regulator; and
   a ground pad to which a ground voltage is supplied, wherein
   the reference voltage generation circuit is disposed between the ground pad and the regulator.

7. The integrated circuit device according to claim 1, further comprising:
   a temperature sensor; and
   a temperature compensation circuit that performs temperature compensation of an oscillation frequency of the oscillation circuit based on a temperature detection voltage from the temperature sensor, wherein
   when a direction from the first side toward the third side is a first direction, and a direction from the second side toward the fourth side is a second direction, the temperature sensor is disposed in the second direction of the oscillation circuit.

8. The integrated circuit device according to claim 7, wherein
the temperature sensor is disposed at a corner portion in which the first side and the fourth side intersect each other.

9. The integrated circuit device according to claim 1, further comprising:
a clock pad that outputs the clock signal, wherein
the clock pad is disposed in the output circuit.

10. The integrated circuit device according to claim 1, further comprising:
a power supply pad to which a power supply voltage is supplied; and
a ground pad to which a ground voltage is supplied, wherein
the power supply pad is disposed along the second side, and
the ground pad is disposed along the fourth side.

11. The integrated circuit device according to claim 1, wherein
the oscillation circuit is disposed in a direction along the first side as a longitudinal direction.

12. The integrated circuit device according to claim 1, wherein
the output circuit is disposed in a direction along the second side as a longitudinal direction.

13. An oscillator comprising:
the integrated circuit device according to claim 1; and
a resonator.

14. An electronic apparatus comprising:
the integrated circuit device according to claim 1; and
a processing device that operates in response to the clock signal.

15. A vehicle comprising:
the integrated circuit device according to claim 1; and
a processing device that operates in response to the clock signal.

* * * * *